United States Patent
Hsieh

(10) Patent No.: US 8,680,610 B2
(45) Date of Patent: Mar. 25, 2014

(54) TRENCH MOSFET HAVING FLOATING DUMMY CELLS FOR AVALANCHE IMPROVEMENT

(75) Inventor: Fu-Yuan Hsieh, New Taipei (TW)

(73) Assignee: Force MOS Technology Co., Ltd., New Taipei (TW)

(\*) Notice: Subject to any disclaimer, the term of this patent is extended or adjusted under 35 U.S.C. 154(b) by 243 days.

(21) Appl. No.: 13/277,614

(22) Filed: Oct. 20, 2011

(65) Prior Publication Data

US 2012/0032261 A1 Feb. 9, 2012

Related U.S. Application Data

(63) Continuation-in-part of application No. 12/654,327, filed on Dec. 17, 2009, now Pat. No. 8,058,685.

(51) Int. Cl.
*H01L 29/772* (2006.01)

(52) U.S. Cl.
USPC .... 257/330; 257/332; 257/302; 257/E27.091; 257/E29.198; 257/E29.2; 257/E29.201; 257/E29.257; 257/E29.26; 257/E21.548; 257/E21.549; 257/E21.55; 257/E21.551; 257/E21.553; 257/E21.655

(58) Field of Classification Search
None
See application file for complete search history.

(56) References Cited

U.S. PATENT DOCUMENTS 8,058,685 B2 \* 11/2011 Hsieh .............................. 257/330
2004/0021174 A1 \* 2/2004 Kobayashi ..................... 257/330

\* cited by examiner

*Primary Examiner* — Fei Fei Yeung Lopez
(74) *Attorney, Agent, or Firm* — Bacon & Thomas, PLLC

(57) ABSTRACT

A trench MOSFET comprising source regions having a doping profile of a Gaussian-distribution along the top surface of epitaxial layer and floating dummy cells formed between edge trench and active area is disclosed. A SBR of n region existing at cell corners renders the parasitic bipolar transistor difficult to turn on, and the floating dummy cells having no parasitic bipolar transistor act as buffer cells to absorb avalanche energy when gate bias is increasing for turning on channel, therefore, the UIS failure issue is avoided and the avalanche capability of the trench MOSFET is enhanced.

20 Claims, 23 Drawing Sheets

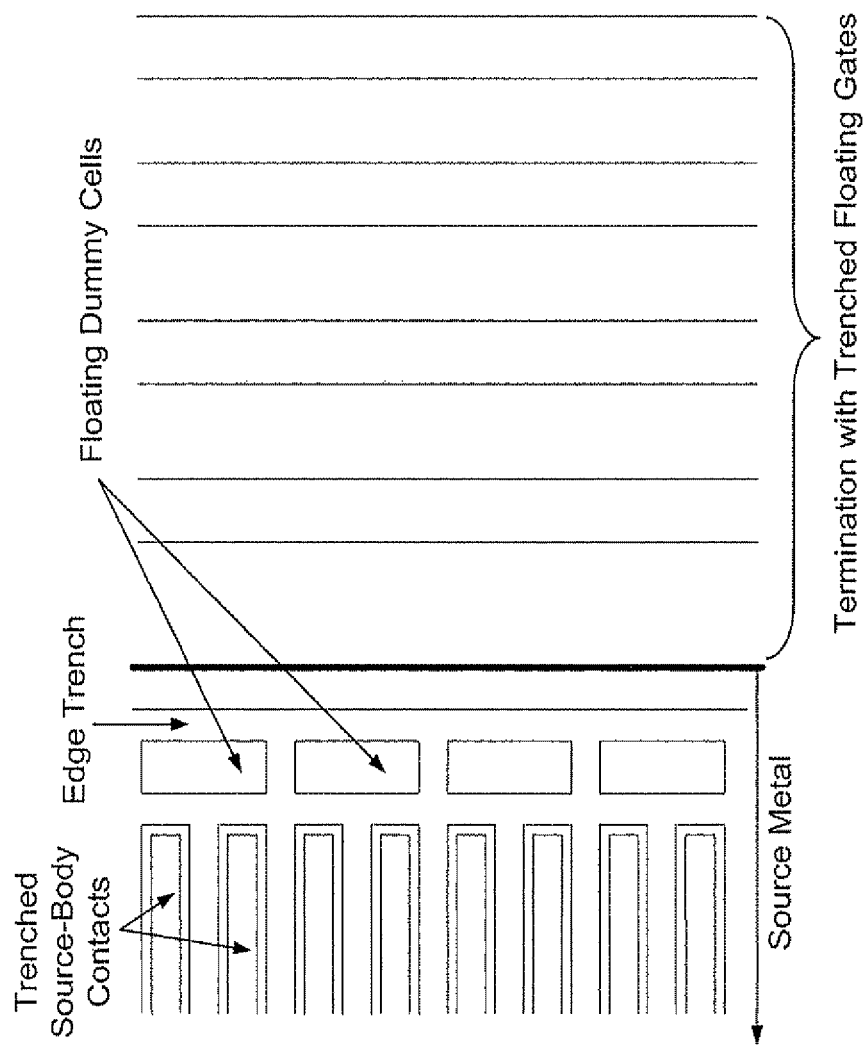

TRENCH MOSFET HAVING FLOATING DUMMY CELLS FOR AVALANCHE IMPROVEMENT

CROSS-REFERENCE TO RELATED APPLICATION

This application is a Continuation-In-Part of U.S. patent application Ser. No. 12/654,327 of the same inventor, filed on Dec. 17, 2009 entitled "Trench MOSFET structures using three masks process".

FIELD OF THE INVENTION

This invention relates generally to the cell structure and device configuration of semiconductor power devices. More particularly, this invention relates to an improved device configuration with floating dummy cells around edge of an active area to enhance the avalanche capability of semiconductor devices.

BACKGROUND OF THE INVENTION

Please refer to FIG. 1A for an active area of a conventional N-channel trench MOSFET structure of prior art (U.S. Pat. No. 6,888,196) with n+ source regions having a same surface doping concentration and a same junction depth along a trenched source-body contact and a channel region. The disclosed N-channel trench MOSFET cell is formed in an N epitaxial layer 102 supported on an N+ substrate 100. Near a top surface of a P body region 103, which is formed within the N epitaxial layer 102, an n+ source region 104 is implanted flanking trenched gates formed in trenches 105 and adjacent to sidewalls of a trenched source-body contact 106. As mentioned above, the n+ source region 104 has a same doping concentration at a same distance from a top surface of the N epitaxial layer 102, and the n+ source region 104 has a same junction depth (Ds, as illustrated in FIG. 1A) from the top surface of the N epitaxial layer 102, which is related to the formation method of the n+ source region 104.

FIG. 1B shows the fabrication method of the n+ source region 104. After formation of the P body region 103 and its diffusion step, the n+ source region 104 is formed by performing a source dopant ion implantation through a source mask (not shown). The top surface of the P body region 103 suffered the same source dopant ion implantation and the same dopant diffusion step, therefore the n+ source region 104 has a same doping concentration at a same distance from the top surface of the N epitaxial layer 102, and the n+ source region 104 has a same junction depth from the top surface of the N epitaxial layer 102.

This uniform distribution of the doping concentration and the junction depth of the n+ source region may lead to a hazardous failure during a UIS (Unclamped Inductance Switching) test, please refer to FIG. 1C for a top view of the n+ source region 104 and the trenched source-body contact 106 shown in FIG. 1A. As illustrated, $R_{be}$ is a base resistance from the trenched source-body contact 106 to a cell corner; $R_{be}$ is a base resistance from the trenched source-body contact 106 to a cell edge. Obviously, $R_{bc}$ is greater than $R_{be}$ because the distance from the trenched source-body contact 106 to the cell corner is longer than that from the trenched source-body contact 106 to the cell edge, resulting in UIS failure occurring at trench corners and a poor avalanche capability for closed cells at cell corners because a parasitic NPN bipolar transistor (as illustrated in FIG. 1A) is easily turned on.

FIG. 1D is a top view of the conventional trench MOSFET of prior art. After the UIS test, failed sites always occur near an edge of the active area of the trench MOSFET, as shown in FIG. 1D, which is resulted from the turning on of the parasitic bipolar transistor, as illustrated in FIG. 1A. The trenched gates in an edge trench (as illustrated in FIG. 1D) near the edge of the active area are turned on first when bias voltage on a gate metal runner is increasing for turning on a channel region, resulting in the parasitic bipolar transistor turning on first near the edge of the active area, thus weakening the avalanche capability of the trench MOSFET.

Accordingly, it would be desirable to provide a new and improved device configuration to enhance the avalanche capability of semiconductor power devices.

SUMMARY OF THE INVENTION

It is therefore an aspect of the present invention to provide a new and improve device configuration so that the avalanche capability of a semiconductor power devices is enhanced without sacrificing other performances. According to the present invention, there is provided a trench semiconductor power MOSFET comprising a plurality of transistor cells each composed of a first type trenched gate surrounded by a source region of a first conductivity type in an active area encompassed in a body region of a second conductivity type above a drain region disposed on a bottom surface of a low-resistivity substrate of the first conductivity type, wherein the first type trenched gate is composed of a doped poly-silicon layer padded by a first insulation layer as a gate oxide and the transistor cells are formed in an epitaxial layer of the first conductivity type over the low-resistivity substrate wherein the epitaxial layer has a lower doping concentration than the low-resistivity substrate, each of the transistor cells further comprising: at least one second type trenched gate composed of the doped poly-silicon layer padded by the first insulation layer; a second insulation layer functioning as a contact interlayer; a trenched source-body contact penetrating through the second insulation layer and the source region, and extending into the body region to contact both the source region and the body region in each of the transistor cells, wherein each the source region has a lower doping concentration and a shallower junction depth along a channel region than along an edge of the trenched source-body contact at a same distance from a top surface of the epitaxial layer, and the source region has a doping profile of a Gaussian-distribution along the top surface of the epitaxial layer from the edge of trenched source-body contact to the channel region; at least one trenched gate contact penetrating through the second insulation layer and extending into the doped poly-silicon layer in the second type trenched gate; a body contact region heavily doped with the second conductivity type underneath the source region and within the body region, surrounding at least bottom of the trenched source-body contact; at least one floating dummy cell formed between an edge trench and the active area, having the body region but without having the source region and the trenched source-body contact, wherein the body region in the floating dummy cell has a floating voltage; the trench semiconductor power MOSFET further comprising: a plurality of third type trenched gates as multiple trenched floating gates in a termination area, composed of the doped poly-silicon layer padded by the first insulation layer, surrounded by the body region without the source region between two adjacent the third type trenched gates in the termination area, wherein each trench depth of the third type trenched gates is equal to or deeper than a junction depth of the body region; a source metal connected to the source region and the body region in each of the transistor cells; and a gate metal connected to the second type trenched gate.

Some preferred embodiments include one or more detail features as followed: the trenched source-body contact has vertical sidewalls in the source region and the body region; the trenched source-body contact has slope sidewalls in the source region and the body region; the trenched source-body contact has vertical sidewalk in the source region, and has slope sidewalls in the body region; the source metal and the gate metal are composed of Al alloys or Cu alloys; the trenched source-body contact and the trenched gate contact are filled with a W (Tungsten) plug padded by a barrier metal layer of Ti/TiN or Co/TiN, which is connected to the source metal and the gate metal, respectively; the trenched source-body contact and the trenched gate contact are filled with the source metal and the gate metal, respectively; the trench semiconductor power MOSFET further comprising a resistance-reduction layer of Ti or Ti/TiN padded underneath the source metal and the gate metal; the transistor cells are composed of square or rectangular closed cells; the transistor cells are composed of stripe cells; the floating dummy cell is composed of a square or rectangular closed cell; each of the third type trenched gates has a trench width equal to or greater than the first type trenched gate; there is no edge trenched contact in the body between the edge trench and the termination area, and the body region between the edge trench and the termination area has a floating voltage; the second insulation layer is composed of a layer of BPSG or PSG and a layer of un-doped SRO underneath, the trenched source-body contact has a greater trench width in the BPSG or PSG layer than in the un-doped SRO layer; the second insulation layer is alternatively composed of a layer of un-doped SRO or un-doped oxide.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 13 is a top view of another preferred embodiment with floating dummy cells according to the present invention.

DETAILED DESCRIPTION OF THE EMBODIMENTS

In the following Detailed Description, reference is made to the accompanying drawings, which forms a part hereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 2A:
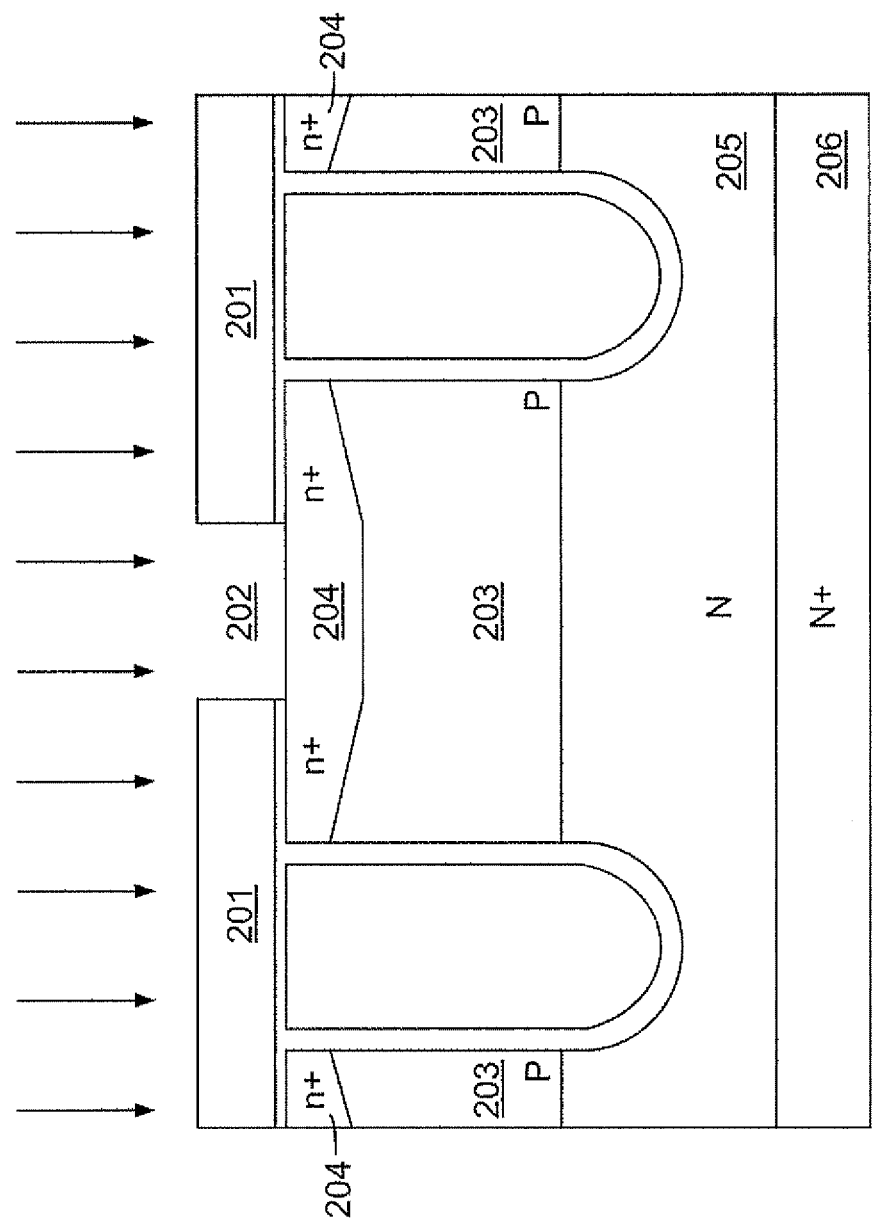
FIG. 2A is a side cross-sectional view for showing the formation method of the source region according to the present invention.

FIG. 2A shows the fabrication method of an n+ source region 204 without requiring a source mask according to the present invention. After formation of a P body region 203 and its diffusion step, the n+ source region 204 is formed by performing a source dopant ion implantation through a contact hole 202 in a contact interlayer 201 covering an N epitaxial layer 205 supported over an N+ substrate 206, which means the n+ source region 204 is implanted after forming the contact interlayer 201, as shown in FIG. 2A. Using this method, the n+ source region 204 has a higher doping concentration and a greater junction depth near the contact hole 202 than along an adjacent channel region at a same distance from a top surface of the N epitaxial layer 205, and the n+ source region 204 has a doping profile of a Gaussian-distribution along the top surface of the N epitaxial layer 205 from the contact hole 202 to the adjacent channel region, resulting in a lower base resistance than the prior art discussed above. The contact interlayer 201 is an un-doped oxide layer or an un-doped SRO(Silicon Rich Oxide). In an alternative, the contact interlayer 201 can also be implemented by comprising a layer of BPSG (Boron Phosphorus Silicon Glass) or PSG (Phosphorus Silicon Glass) and a layer of un-doped SRO (Silicon Rich Oxide) or un-doped oxide underneath, and the contact hole 202 has a greater trench width in the BPSG or PSG layer than in the un-doped SRO layer because during etching process, the BPSG or PSG has an about 5~10 times etching rate of the un-doped SRO if dilute HF chemical is used.

Figure 2B:
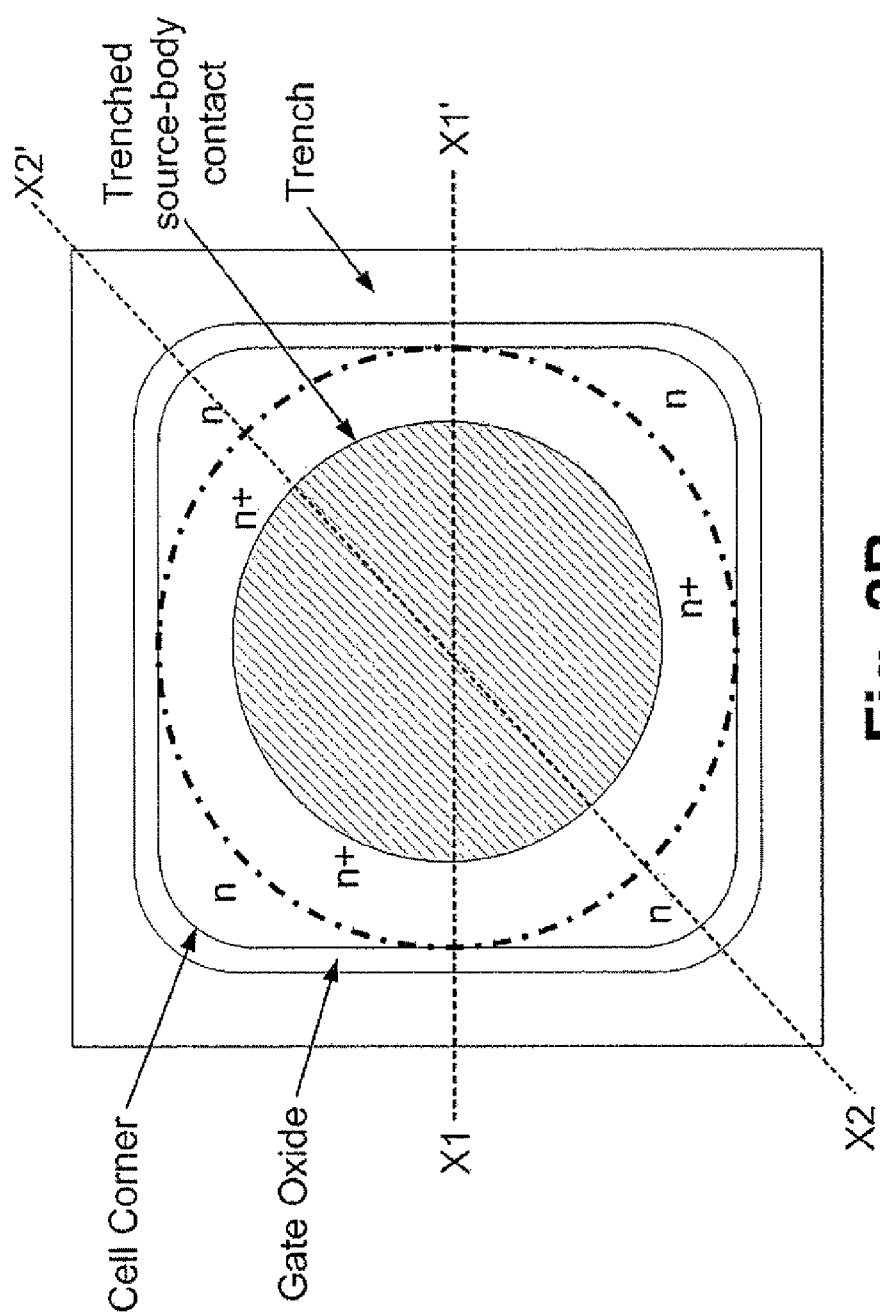
FIG. 2B is a top view of a cell structure for showing a source region diffusion method according to the present invention.
Figure 2C:
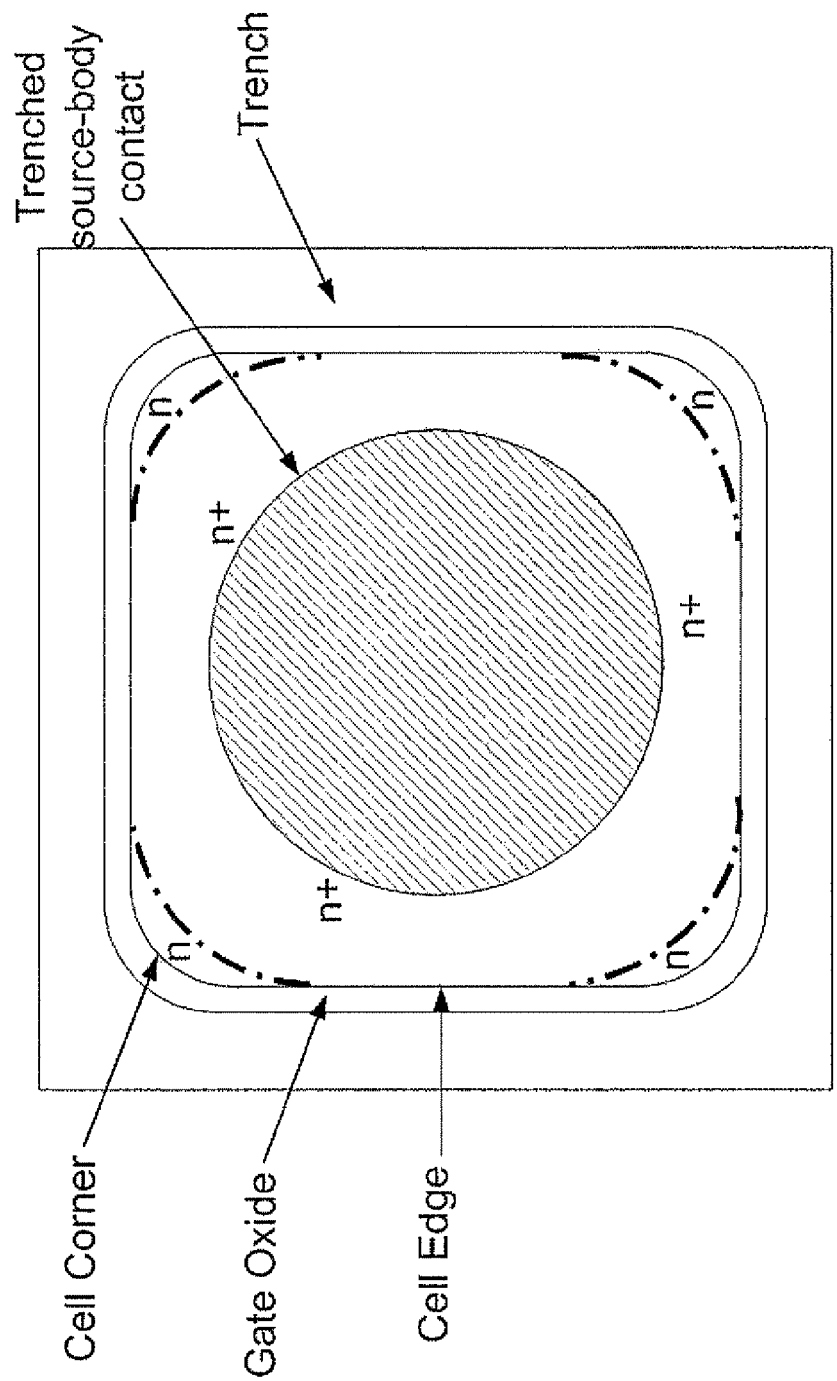
FIG. 2C is a top view of a cell structure for showing another source region diffusion method according to the present invention.

Please refer to FIG. 2B for a top view of a cell structure of an N-channel trench semiconductor power MOSFET according to the present invention, the dash-dotted line illustrates an area of the n+ source region with a doping concentration no less than $1 \times 10^{19}$ cm$^{-3}$. At each cell corner, the illustrated a region has a lower doping concentration due to the Gaussian-distribution, which is less than $1 \times 10^{19}$ cm$^{-3}$. Therefore, a SBR (Source Ballast Resistance) of the n region exists at each cell corner, which reduces the emitter injection efficiency of the parasitic NPN bipolar transistor, thus making it difficult to turn on, avoiding the UIS failure issue and improving the avalanche capability. In another preferred embodiment, the dopant of the source region is diffused further after reaching each cell edge to optimize a trade-off between Rds (drain-source resistance) and the avalanche capability, please refer to FIG. 2C for a top view of another cell structure of an N-channel trench MOSFET according to the present invention. At the cell edge, the n+ source region is adjacent to a gate oxide, therefore the area of the lower doped n region at the cell corner is smaller than that in FIG. 2B. It seems that the base resistance is reduced at the cell corner, breaching the desire of enhancing the avalanche capability, however, as the Rds is the same important, and it is reduced by shortening the distance from the highly doped n+ region to the cell edge, therefore, a trade-off is achieved between the avalanche capability and the Rds, optimizing the device to a better performance.

Figure 3A:
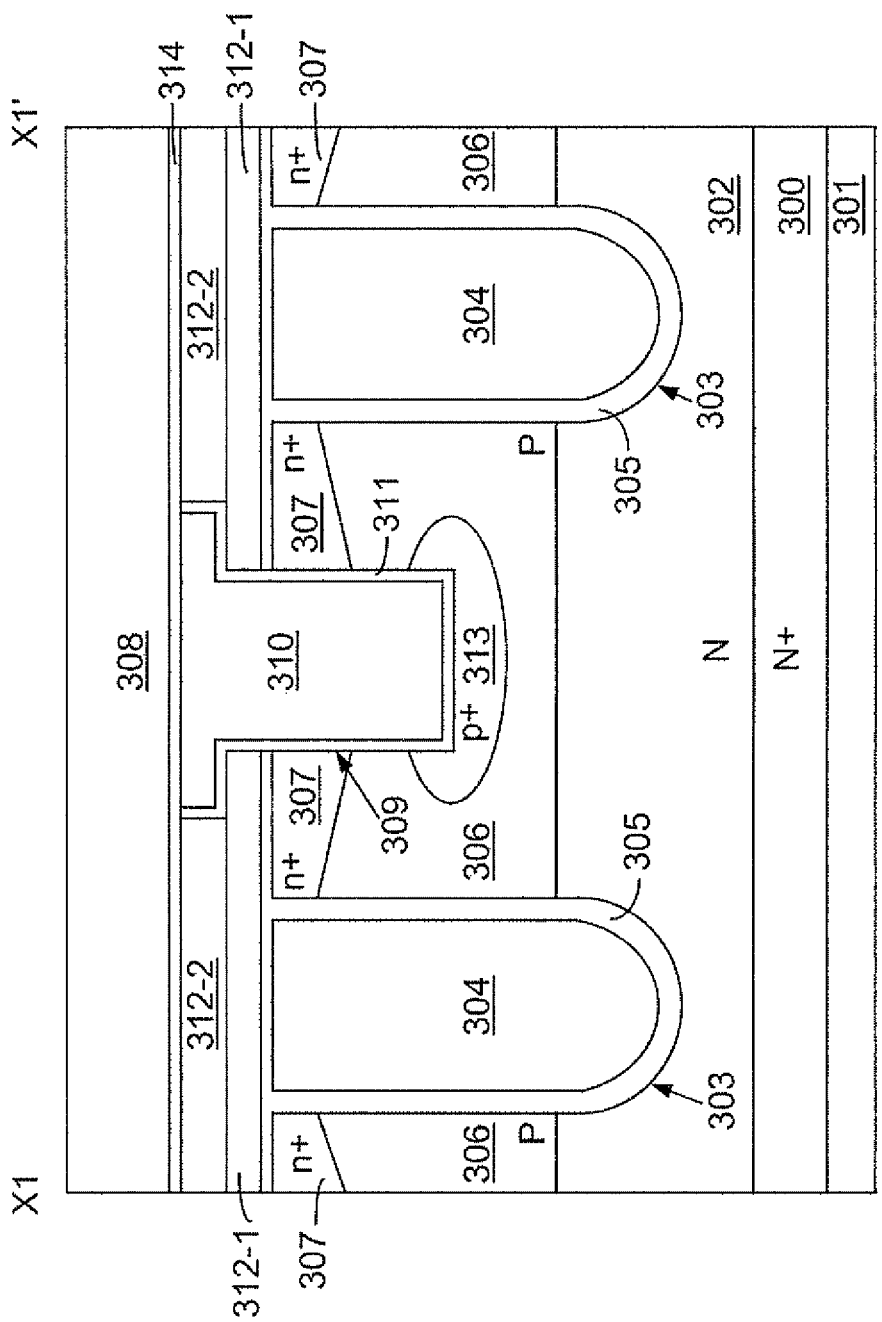
FIG. 3A is a side cross-sectional view of an N-channel trench MOSFET showing a preferred embodiment according to the present invention, which is also the X1-X1' cross section in FIG. 2B.

Please refer to FIG. 3A for a preferred embodiment of this invention, which is also the X1-X1' cross section of FIG. 2B, wherein an N-channel trench semiconductor power MOSFET is formed on an N+ substrate 300 coated with a back metal of Ti/Ni/Ag on rear side as a drain metal 301. Onto the N+ substrate 300, a lighter doped N epitaxial layer 302 is grown, and a plurality of first type trenched gates 303 are formed each comprising a doped poly-silicon layer 304 padded by a first insulation layer 305 as a gate oxide. The n+ source regions 307 flanking the first type trenched gates 303 are formed near a top surface of the P body region 306 encompassed in the N epitaxial layer 302, and are connected to a source metal 308 composed of Al alloys or Cu alloys through a trenched source-body contact 309 which comprises a contact metal plug, for example, a W (tungsten) plug 310 padded by a barrier metal layer 311 of Ti/TiN or Co/TiN or Ta/TiN and is penetrating through a second insulation layer, the source region and extending into the P body region between a pair of the adjacent first type trenched gates 303, wherein the second insulation layer is functioning as a contact interlayer and comprising a layer of un-doped SRO 312-1 and a layer of BPSG or PSG 312-2. Especially, the trenched source-body contact 309 has a greater trench width in the BPSG or PSG layer 312-2 than in other portions for a better metal contact performance between the W plug 310 and the source metal 308. In some other embodiments, the second insulation layer can be implemented by only comprising an insulation layer, for example, a single un-doped SRO layer. As no source mask is required in the fabrication process, the n+ source regions 307 are laterally diffused from under a contact hole between a pair of the adjacent first type trenched gates 303, to an adjacent channel region nearby, wherein the contact hole is opened through the BPSG or PSG layer 312-2 and the un-doped SRO layer 321-1 until the top surface of the P body region 306. The n+ source regions 307 have a doping concentration along a channel region lower than along an adjacent edge of the trenched source-body contact 309 at a same distance from a top surface of the N epitaxial layer 302, and the n+ source regions 307 have a shallower junction depth along the channel region than along the trenched source-body contact 309, and the n+ source regions 307 have a doping profile of a Gaussian-distribution along the top surface of the N epitaxial layer 302 from the trenched source-body contact 309 to the channel region. A p+ body contact region 313 having a higher doping concentration than the P body region 306 is formed under the n+ source region 307 and surrounding at least bottom of the trenched source-body contact 309 to reduce the contact resistance between the W plug 310 and the P body region 306. A resistance-reduction layer 314 of Ti or Ti/TiN is padded underneath the source metal layer 308 such as Al alloys layer.

Figure 3B:
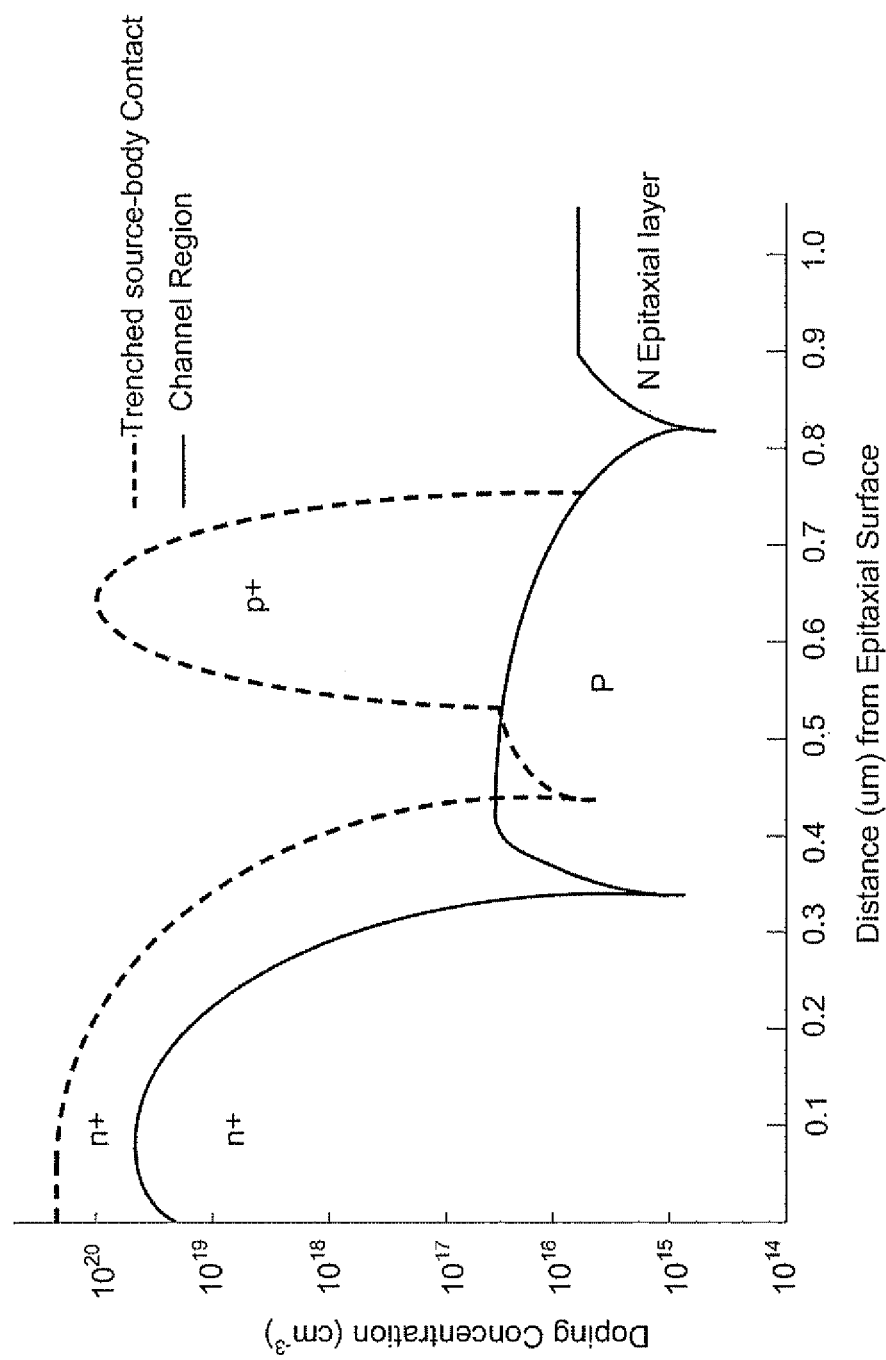
FIG. 3B is the doping profiles for showing the relationship between distance from epitaxial layer surface and doping concentration in a trenched source-body contact and a channel region according to the present invention, respectively.

In order to further make it clear, FIG. 3B illustrates the doping profiles along the edge of the trenched source-body contact 309 and the channel region from the surface of the N epitaxial layer 302 in the N-channel trench semiconductor power MOSFET shown in FIG. 3A. In FIG. 3B, n+ represents the n+ source region 307, P represents the P body region 306, and p+ represents the p+ body contact region 313.

Figure 3C:
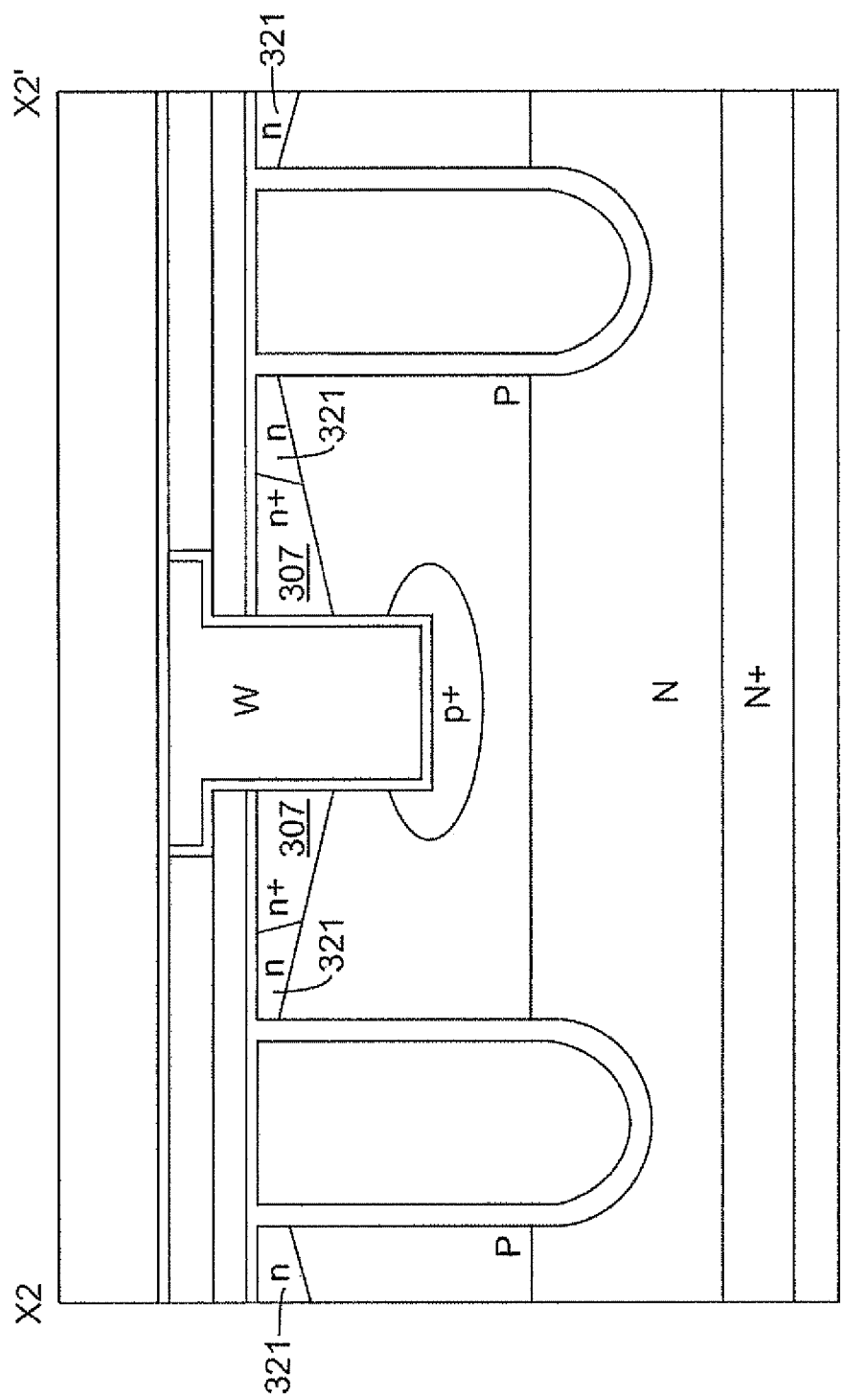
FIG. 3C is another side cross-sectional view of the preferred embodiment shown in FIG. 3A for showing the X2-X2' cross section in FIG. 2B.

FIG. 3C shows the X2-X2' cross section of FIG. 2B, in the cell corners, the n region 321 has a lower doping concentration and a shallower junction depth than the n+ source region 307, resulting in a lower base resistance to further enhance the avalanche capability.

Figure 4:
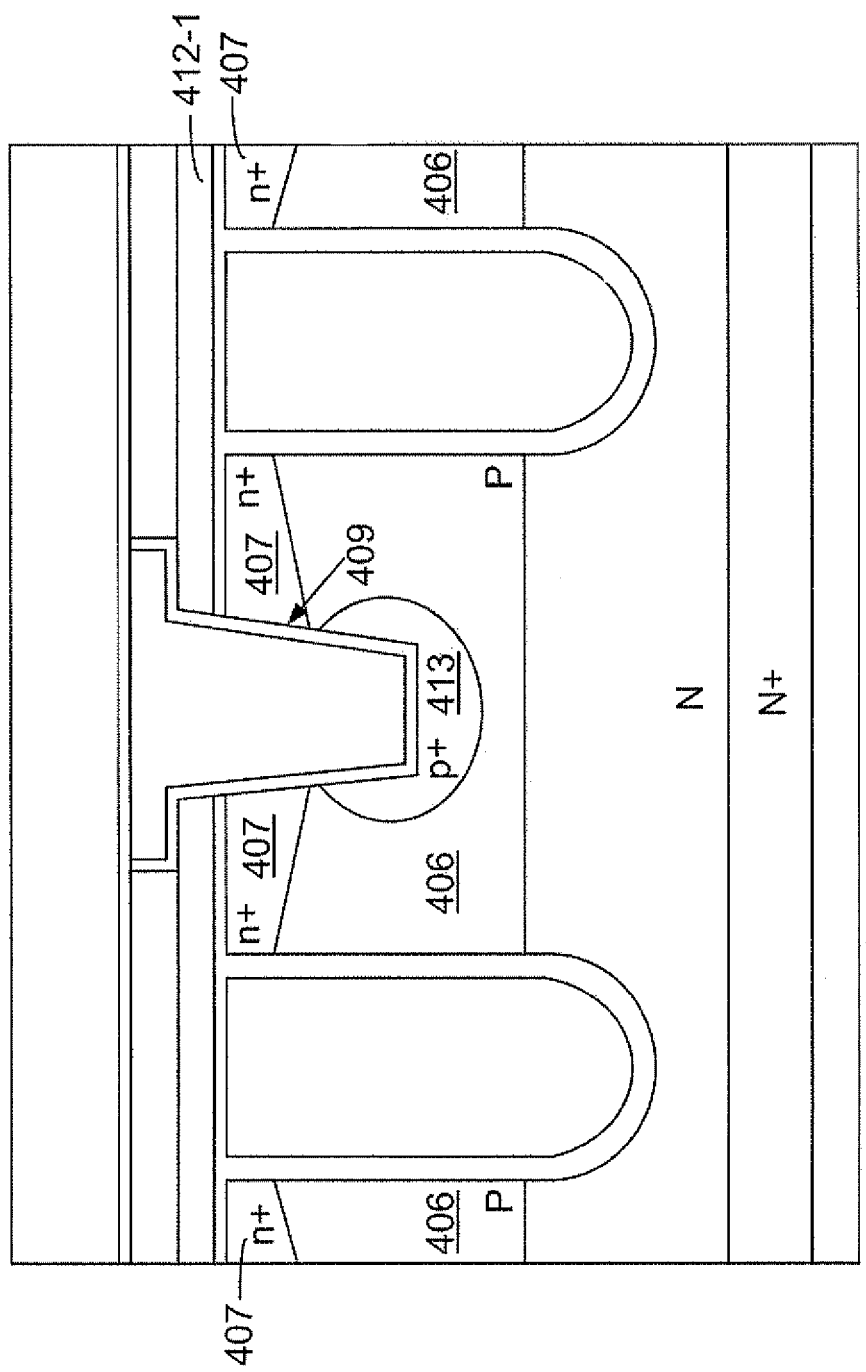
FIG. 4 is a side cross-sectional view of an N-channel trench MOSFET showing another preferred embodiment according to the present invention.

Please refer to FIG. 4 for another preferred embodiment of the present invention, wherein the N-channel trench semiconductor power MOSFET is similar to that in FIG. 3A except that, the trenched source-body contact 409 has slope sidewalls in the P body region 406, in the n+ source region 407 and in the un-doped SRO layer 412-1. By employing this structure, the p+ body contact region 413 is enlarged to wrap the slope sidewalls and the bottom of the trenched source-body contact 409 underneath the n+ source region 407 to further enhance the avalanche capability.

Figure 5:
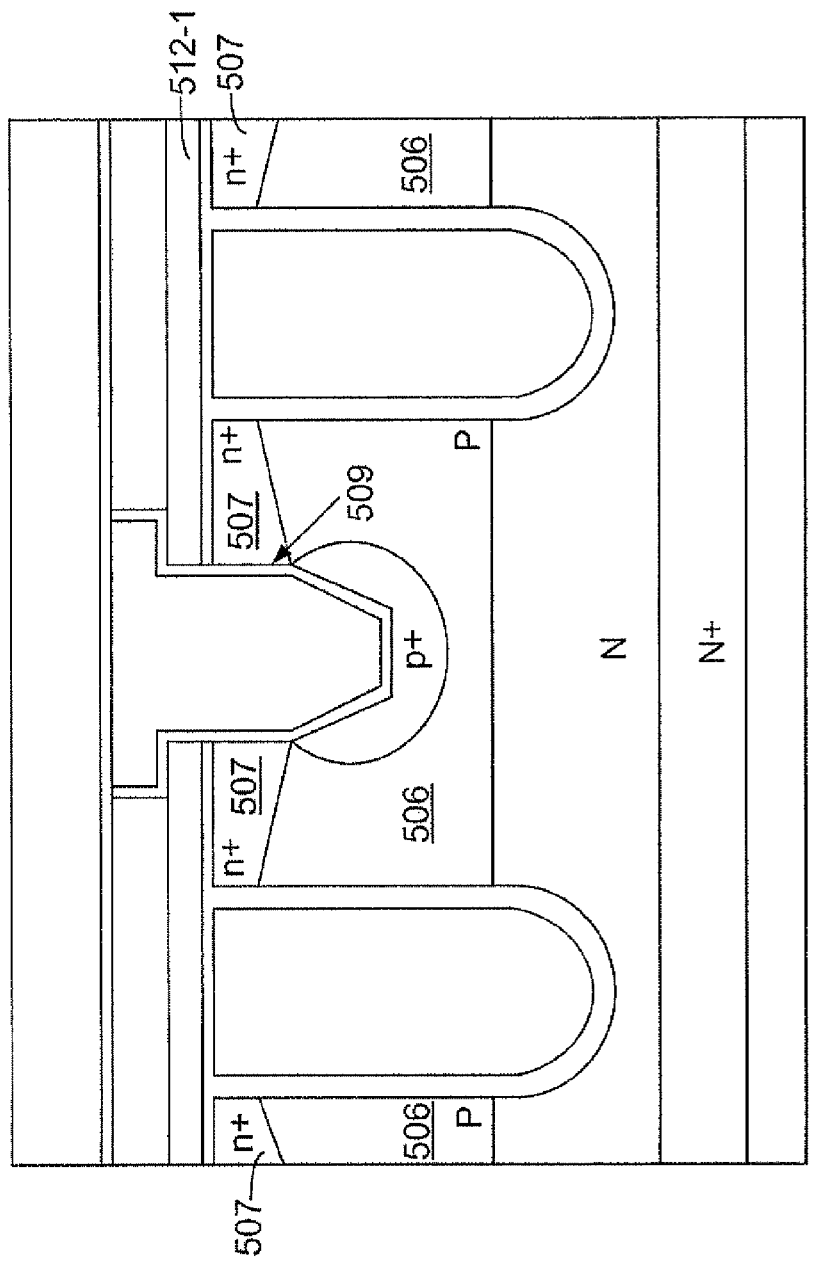
FIG. 5 is a side cross-sectional view of an N-channel trench MOSFET showing another preferred embodiment according to the present invention.

Please refer to FIG. 5 for another preferred embodiment of the present invention, wherein the N-channel trench semiconductor power MOSFET is similar to that in FIG. 4 except that, the trenched source-body contact 509 has slope sidewalls only in the P body region 506 and has vertical sidewalls in the n+ source region 507 and in the un-doped SRO layer 512-1 to prevent the dopant neutralization may introduced by the slope sidewalls in the n+ source region in FIG. 4 when implanting the p+ body contact region which will result in a high source contact resistance.

Figure 6:
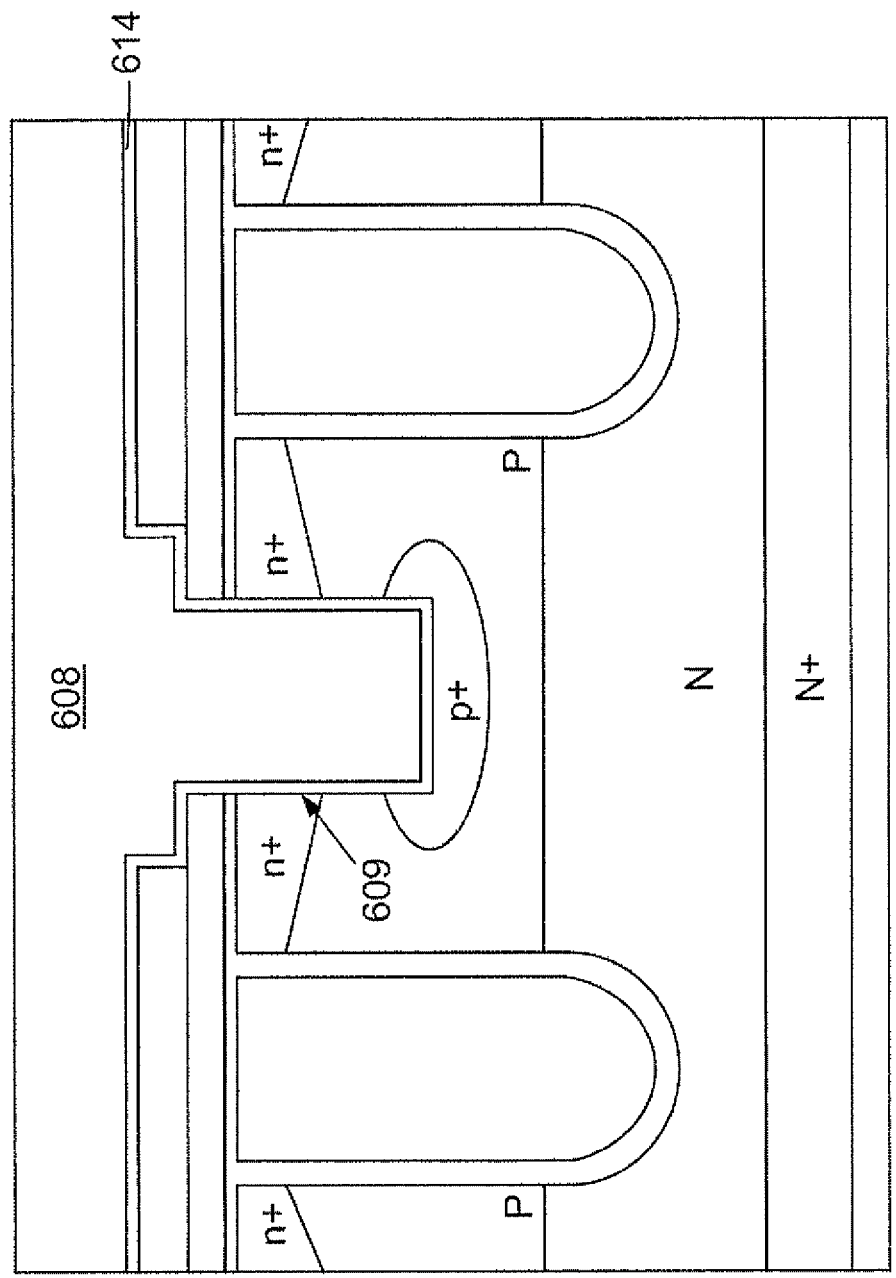
FIG. 6 is a side cross-sectional view of an N-channel trench MOSFET showing another preferred embodiment according to the present invention.

Please refer to FIG. 6 for another preferred embodiment of the present invention, wherein the N-channel trench semiconductor power MOSFET is similar to that in FIG. 3A except that, the trenched source-body contacts 609 is not filled with the W plug in FIG. 3A but the source metal 608 such as Al alloys over a barrier metal layer 614 such as Ti/TiN or Co/TiN.

Figure 7:
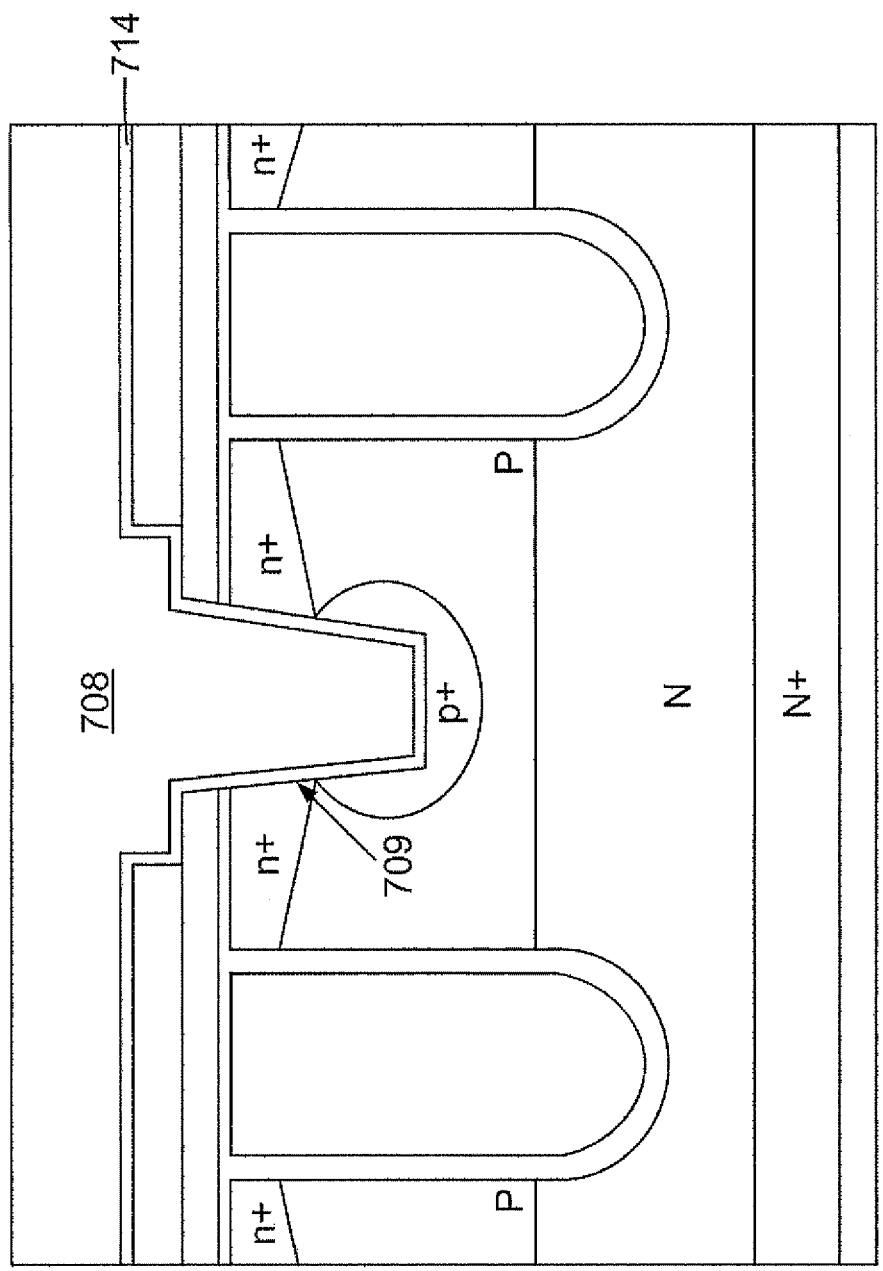
FIG. 7 is a side cross-sectional view of an N-channel trench MOSFET showing another preferred embodiment according to the present invention.

Please refer to FIG. 7 for another preferred embodiment of the present invention, wherein the N-channel trench semiconductor power MOSFET is similar to that in FIG. 4 except that, the trenched source-body contact 709 is not filled with the W plug in FIG. 4 but the source metal 708 over a barrier metal layer 714 such as Ti/TiN or Co/TiN.

Figure 8:
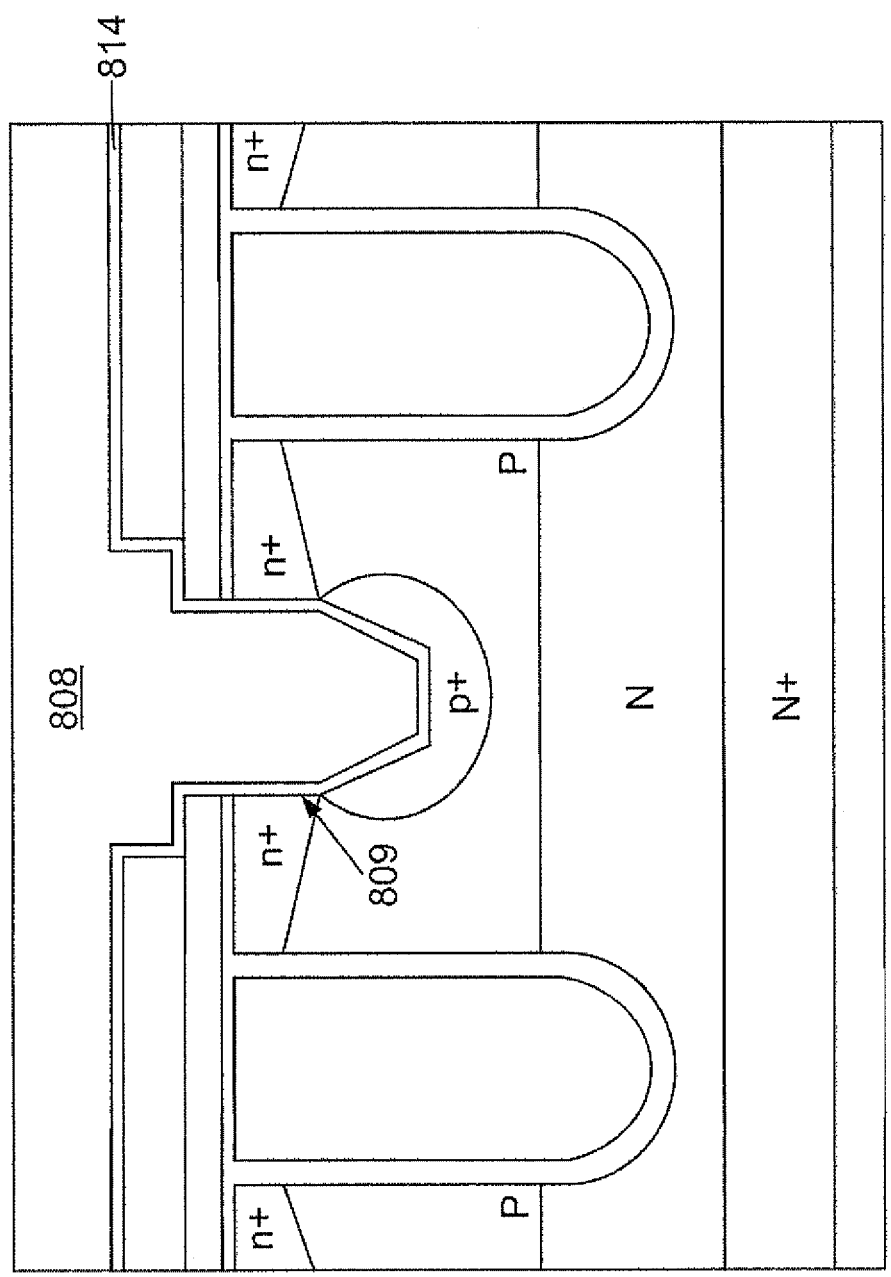
FIG. 8 is a side cross-sectional view of an N-channel trench MOSFET showing another preferred embodiment according to the present invention.

Please refer to FIG. 8 for another preferred embodiment of the present invention, wherein the N-channel trench semiconductor power MOSFET is similar to that in FIG. 5 except that, the trenched source-body contact 809 is not filled with the W plug in FIG. 5 but the source metal 808 over a barrier metal layer 814 such as Ti/TiN or Co/TiN.

Figure 1A:
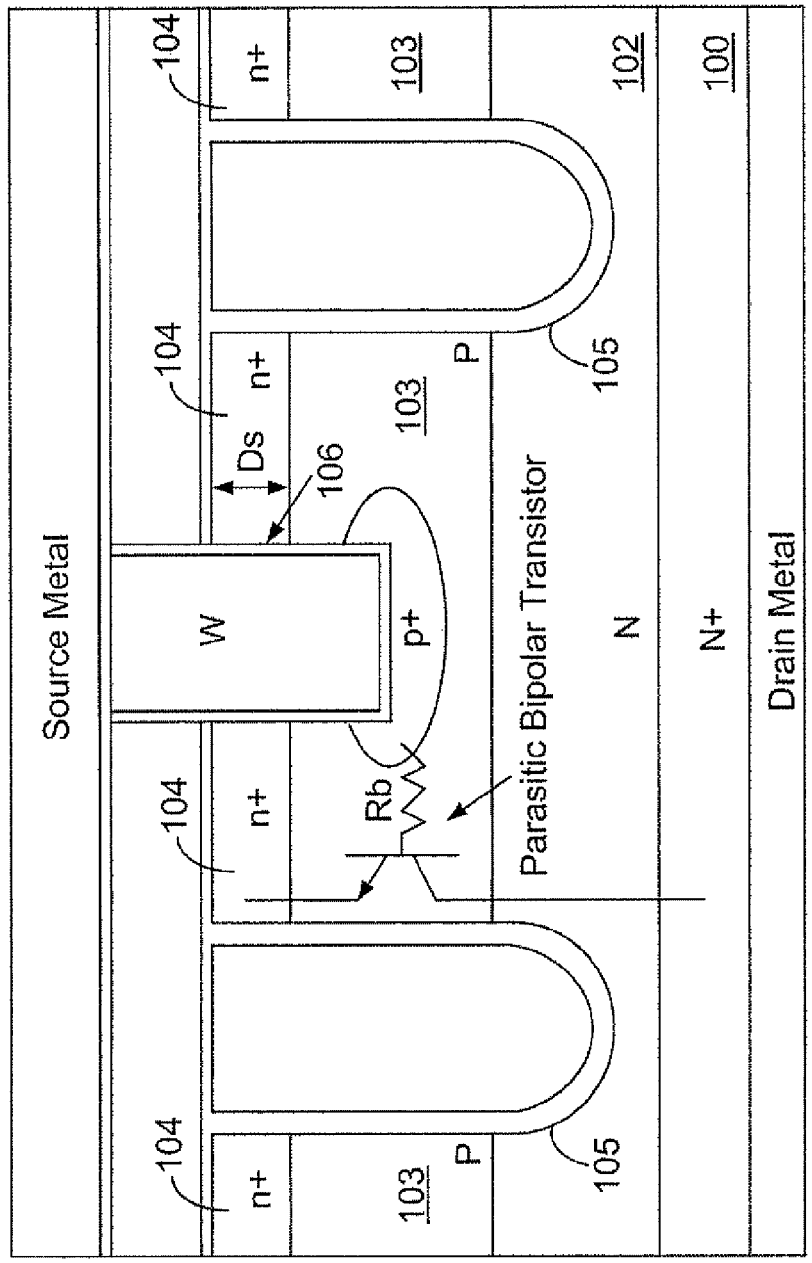
FIG. 1A is a side cross-sectional view of a trench MOSFET of a prior art.
Figure 1B:
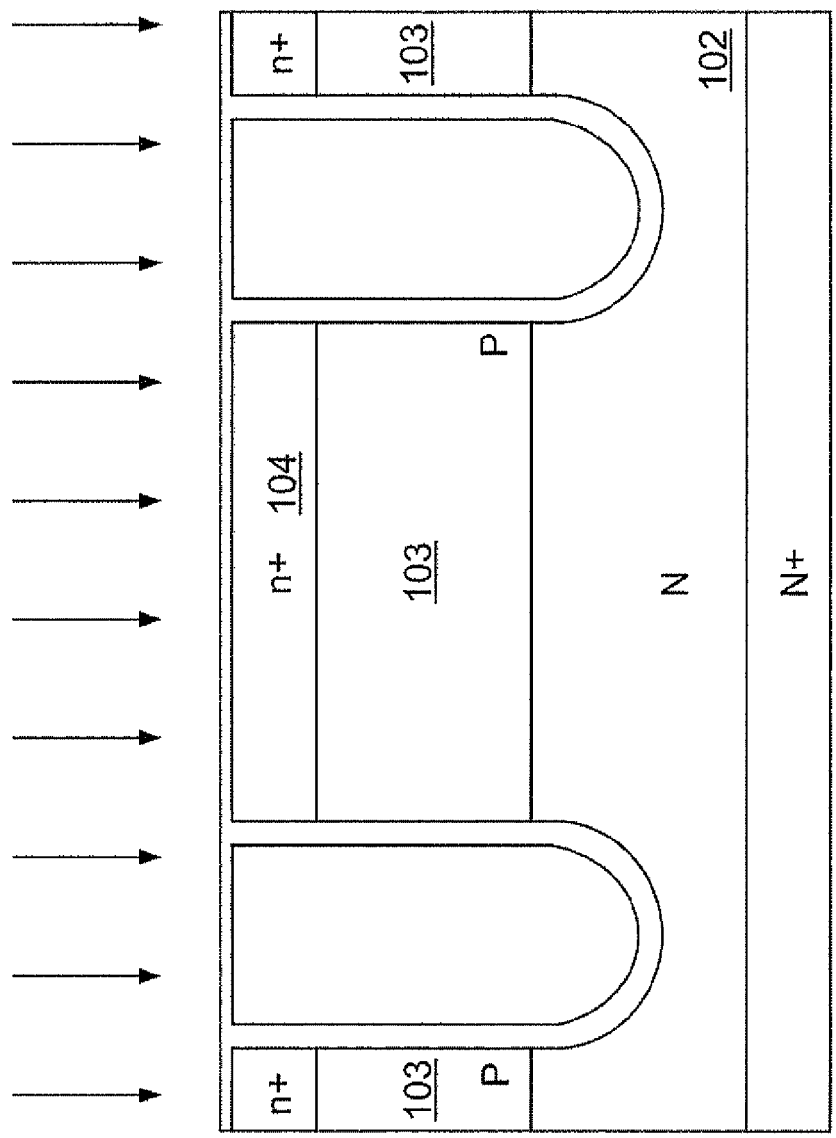
FIG. 1B is a side cross-sectional view for showing the formation method of the source region of the prior art in FIG. 1A.
Figure 1C:
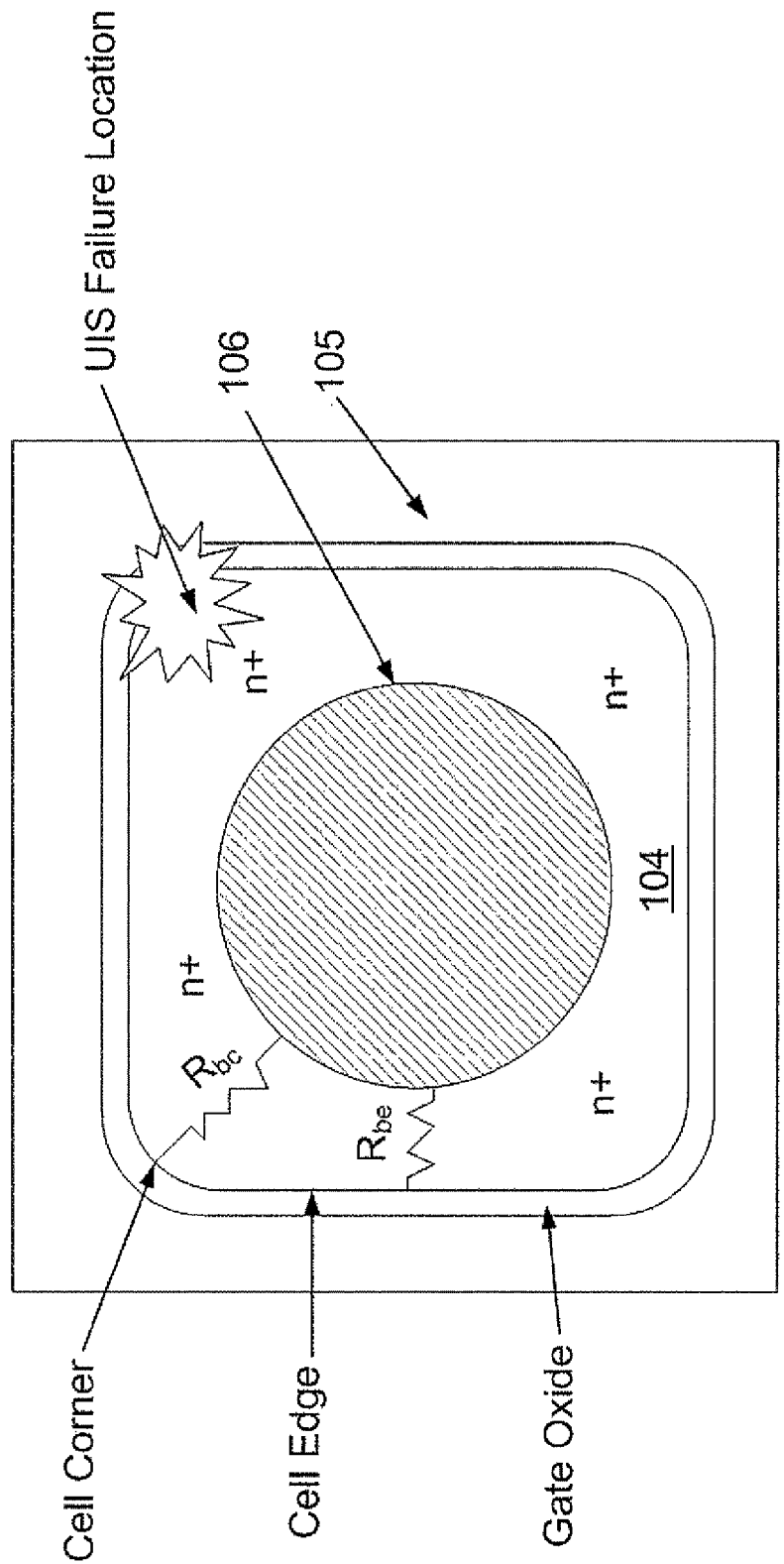
FIG. 1C is a top view of a cell structure for showing the disadvantage of the prior art in FIG. 1A.
Figure 1D:
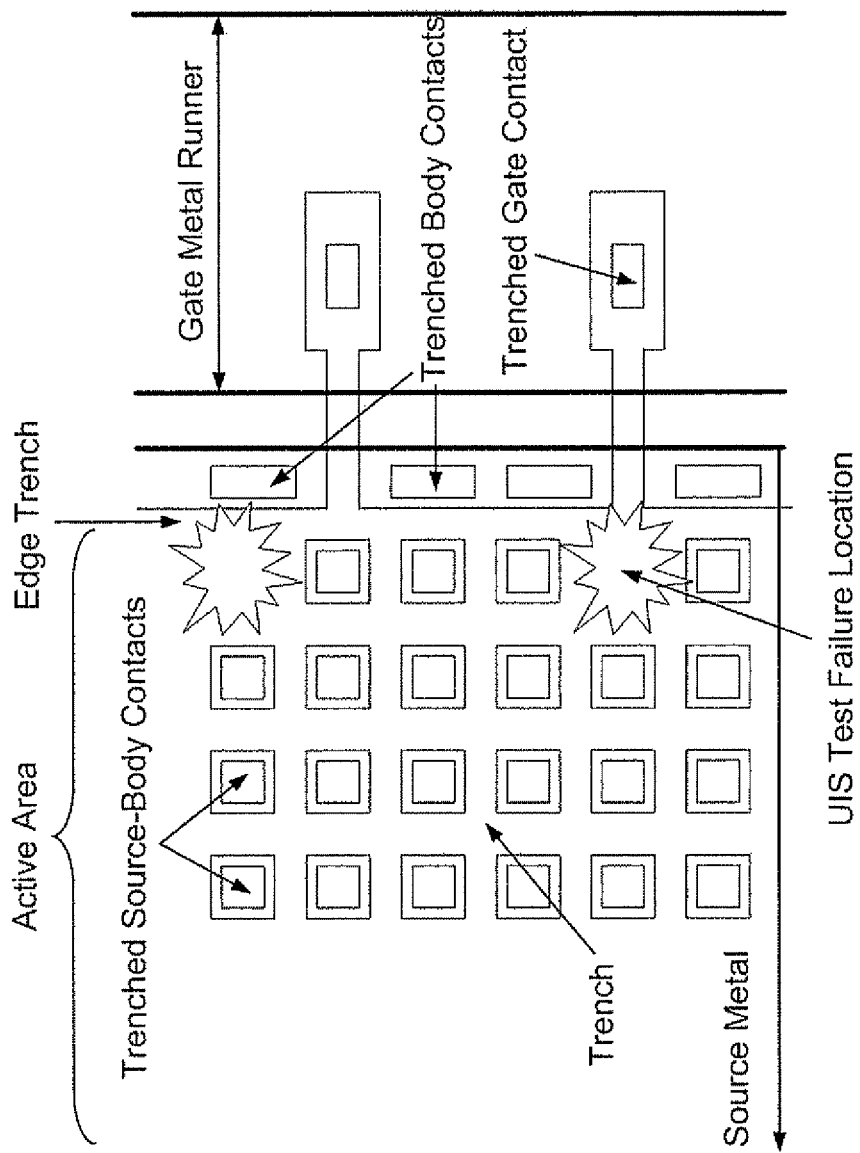
FIG. 1D is a top view of a device structure for showing the disadvantage of the prior art.
Figure 9A:
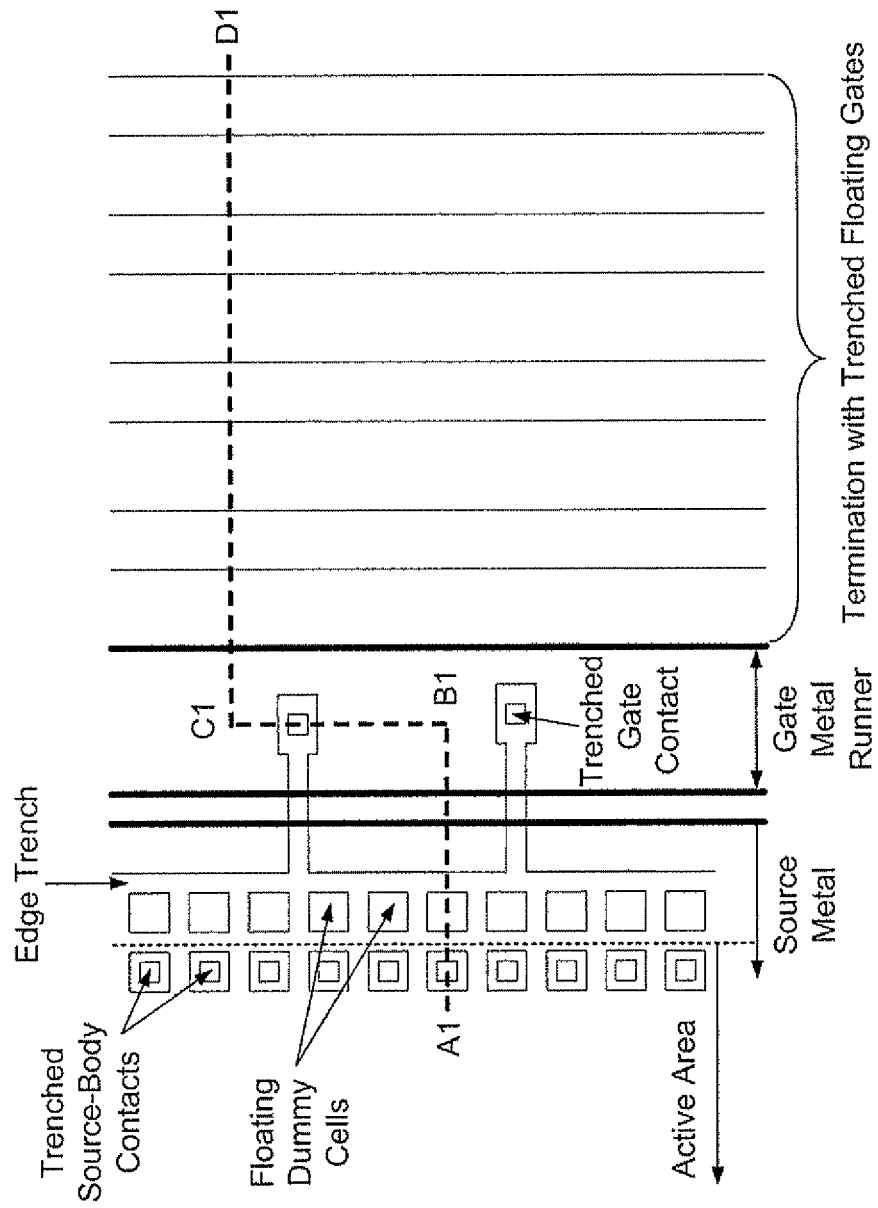
FIG. 9A is a top view of another preferred embodiment with floating dummy cells according to the present invention.
Figure 9B:
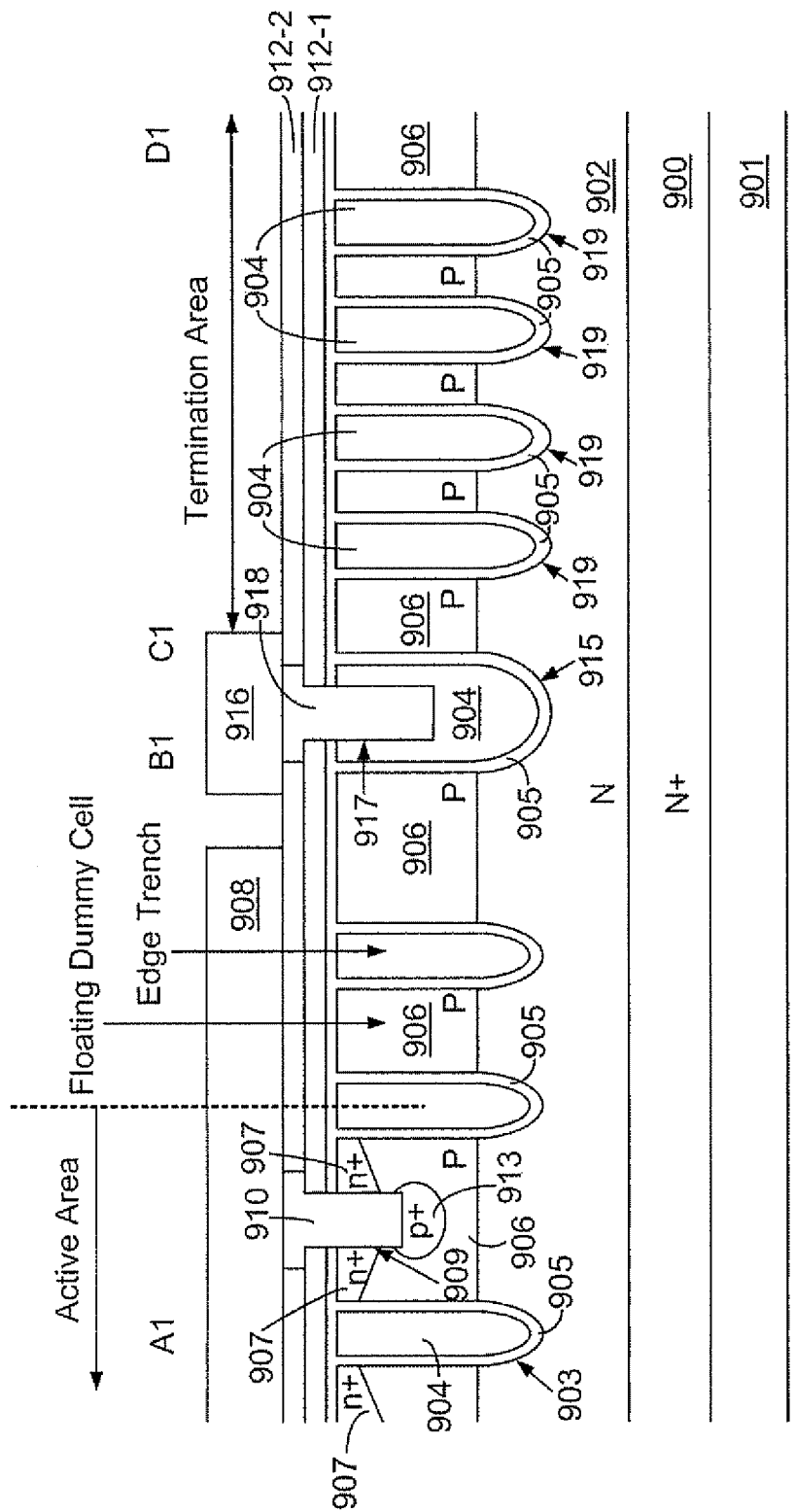
FIG. 9B is a side cross-sectional view showing the A1-B1-C1-D1 cross section of FIG. 9A.

FIG. 9A is a top view of another preferred embodiment showing the source metal area, a gate metal runner area and a termination area of a trench semiconductor power MOSFET, wherein a plurality of floating dummy cells are formed between an edge trench and the active area which has a plurality of transistor cells, wherein both the floating dummy cells and the transistor cells are square closed cells. In some other embodiments, the transistor cells can be implemented by rectangular closed cells. Trenched source-body contacts in the active area are connected to the source metal, and trenched gate contacts are connected to the gate metal runner for gate connection. The trench semiconductor power MOSFET further comprises multiple trenched floating gates in a termination area. FIG. 9B is a side cross-sectional view showing the A1-B1-C1-D1 cross section in FIG. 9A. The N-channel trench semiconductor power MOSFET is formed on an N+ substrate 900 coated with a back metal of Ti/Ni/Ag on rear side as a drain metal 901. Onto the N+ substrate 900, a lighter doped N epitaxial layer 902 is grown, and a plurality of first type trenched gates 903 are formed comprising a doped poly-silicon layer 904 padded by a first insulation layer 905 as a gate oxide. The gate oxide is a single gate oxide having a thickness along trench sidewalls equal to or greater than a trench bottom. Alternatively, the gate oxide is a double gate oxide (not shown) having a thickness along the trench sidewalls less than the trench bottom. The source regions 907 flanking the first type trenched gates 903 are formed near a top surface of a P body region 906 encompassed in the N epitaxial layer 902, and are connected to a source metal 908 composed of Al alloys or Cu alloys through a trenched source-body contact 909, which is comprising a contact metal plug, for example, a W (tungsten) plug 910 padded by a barrier metal layer of Ti/TiN or Co/TiN, and penetrating through a second insulation layer, the n+ source regions 907 and extending into the P body region 906 between a pair of the adjacent first type trenched gates 903, wherein the second insulation layer is functioning as a contact interlayer and comprising a layer of un-doped SRO 912-1 and a layer of BPSG or PSG 912-2. Especially, the trenched source-body contact 909 has a greater trench width in the BPSG or PSG layer 912-2 than in other portions. As no source mask is employed in fabrication process, the n+ source regions 907 are diffused laterally from under a contact hole between the pair of the adjacent first type trenched gates 903, to an adjacent channel region nearby, wherein the contact hole is opened through the second insulation layer until the top surface of the P body region 906, therefore, the n+ source regions 907 have a doping concentration along the channel region lower than along an edge of the trenched source-body contact 909 at a same distance from a top surface of the N epitaxial layer 902, and the n+ source regions 907 have a shallower junction depth along the channel region than along the adjacent edge of the trenched source-body contact 909, and the source regions 907 have a doping profile of a Gaussian-distribution along the top surface of the N epitaxial layer 902 from the edge of the trenched source-body contact 909 to the channel region. A p+ body contact region 913 having a higher doping concentration than the P body region 906 is formed under the n+ source region 907 and surrounding at least bottom of the trenched source-body contact 909 to reduce the contact resistance between the W plug 910 and the P body region 906. The trench semiconductor power MOSFET further comprises at least one second type trenched gate 915 comprising the doped poly-silicon layer 904 padded by the first insulation layer 905, wherein the doped poly-silicon layer 904 in the second type trenched gate 915 is connected to the gate metal runner 916 through a trenched gate contact 917 filled with a W plug 918, which is the same as the W plug 910, for gate connection. At lease one floating dummy cell is formed between the edge trench (as illustrated in FIG. 9A) and the active area, having the P body region 906 but without having the n+ source region and the trenched source-body contact, wherein the P body region 906 in the floating dummy cell has a floating voltage. The trench semiconductor power MOSFET further comprises a plurality of third type trenched gates 919 as multiple trenched floating gates in the termination area, comprising the doped poly-silicon layer 904 padded by the first insulation layer 905 surrounded by the P body regions 906 without having the source region between two adjacent the third type trenched gates 919 in the termination area, wherein each trench depth of the third type trenched gates 919 is equal to or deeper than a junction depth of the P body region 906, and each trench width of the third type trenched gates 919 is equal to or wider than the first type trenched gate 903. The floating dummy cell having no the parasitic bipolar transistor shown in FIG. 1A acts as a buffer cell to absorb avalanche energy during the UIS test when a voltage bias on the gate metal runner is increasing for turning on the channel region, helping to enhance the avalanche capability of the trench semiconductor power MOSFET. There is no edge trenched contact into the body region 906 between the edge trench and the termination area, and said body region 906 between the edge trench and the termination area has a floating voltage.

Figure 9C:
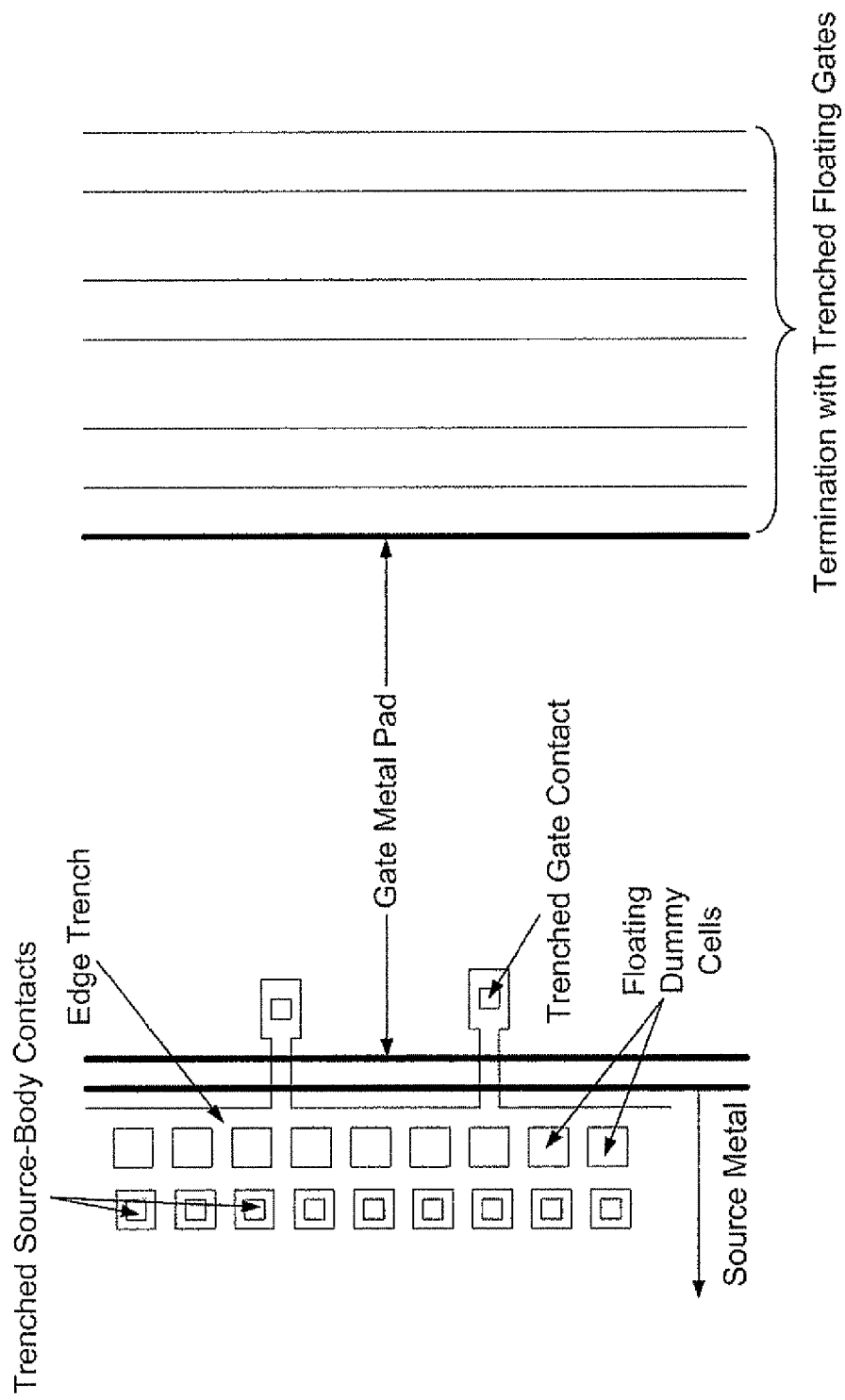
FIG. 9C is another top view of the preferred embodiment in FIG. 9A according to the present invention.

Please refer to FIG. 9C for another top view of the preferred trench semiconductor power MOSFET showing the source metal area, a gate metal pad and the termination area, the difference between the structure in FIG. 9A and the structure in FIG. 9C is that, the trenched gate contacts in FIG. 9C are connected to the gate metal pad instead of the gate metal runner in FIG. 9A.

Figure 10A:
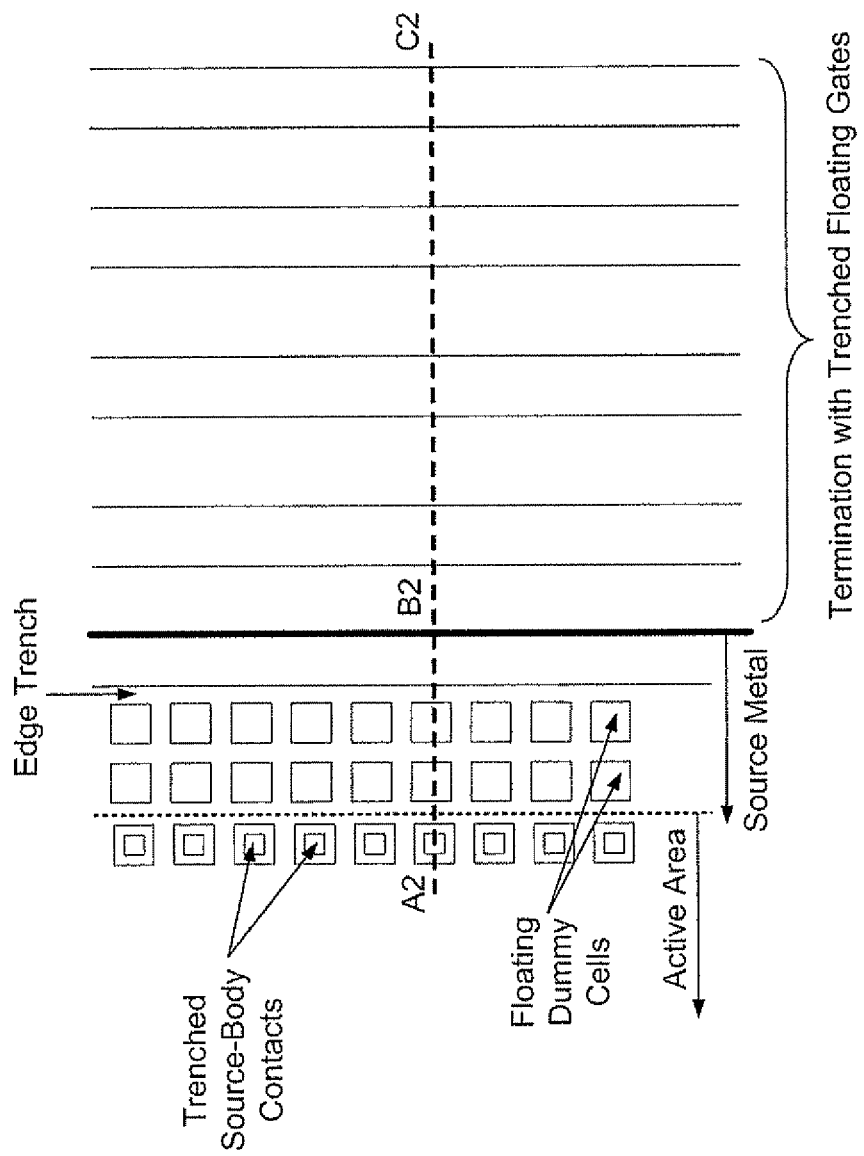
FIG. 10A is a top view of another preferred embodiment with floating dummy cells according to the present invention.

Please refer to FIG. 10A for a top view of another preferred embodiment showing a source metal area and a termination area. The structure of FIG. 10A is similar to the structure of FIG. 9A except that, in FIG. 10A, there is no gate metal runner area between the source metal area and the termination area. In FIG. 9A the gate metal runners are employed for Rg (gate resistance) reduction, and the structure shown in FIG. 10A is usually used in small-size devices.

Figure 10B:
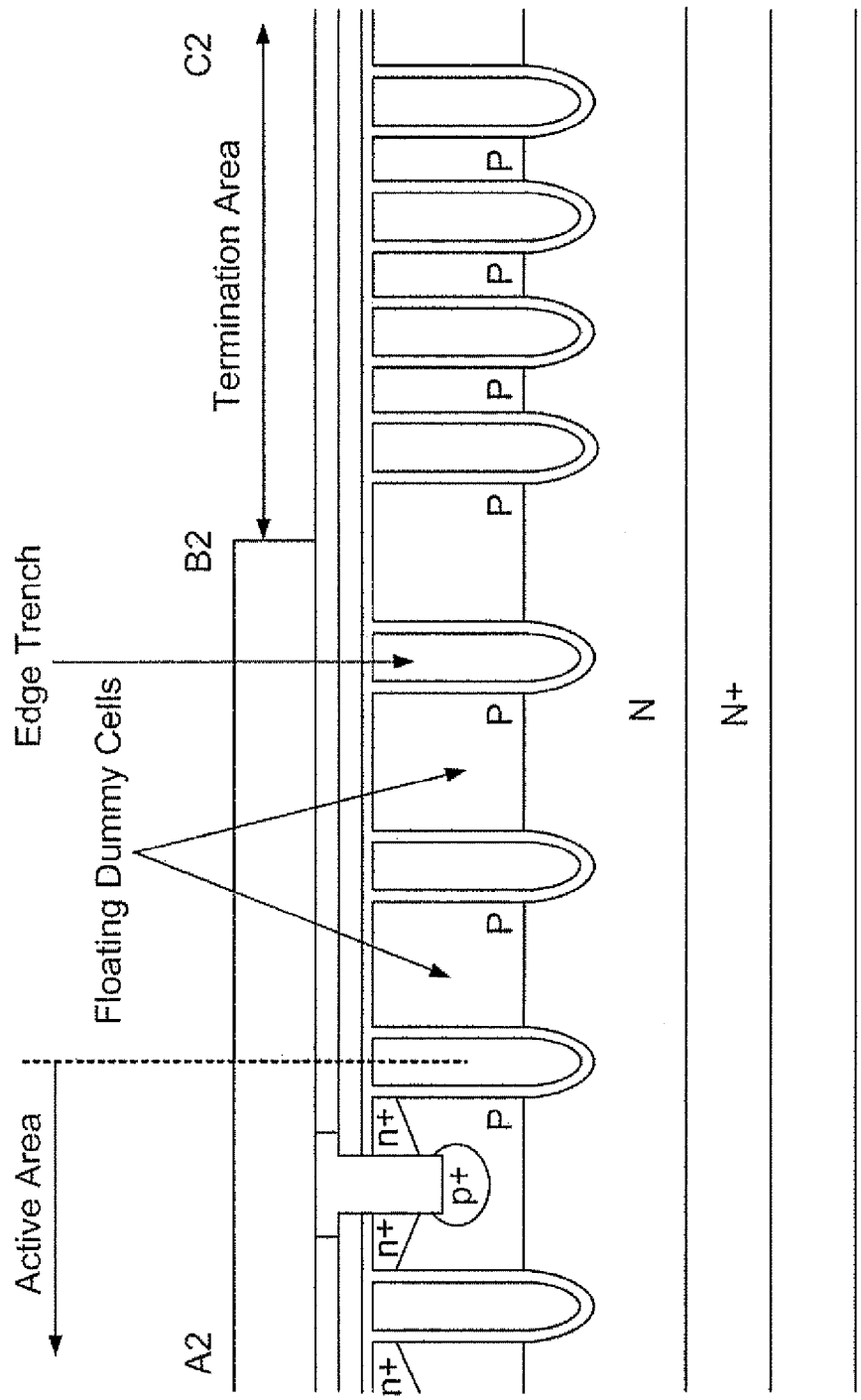
FIG. 10B is a side cross-sectional view showing the A2-B2-C2 cross section of FIG. 10A.

FIG. 10B is a side cross-sectional view of the preferred embodiment showing the A2-B2-C2 cross section in FIG. 10A. The structure of FIG. 10B is similar to the structure of FIG. 9B except that, in FIG. 10B, there is no the gate metal runner area, including the trenched gate contact connected to the gate metal runner or the second type trenched gate underneath the gate metal runner.

Figure 11:
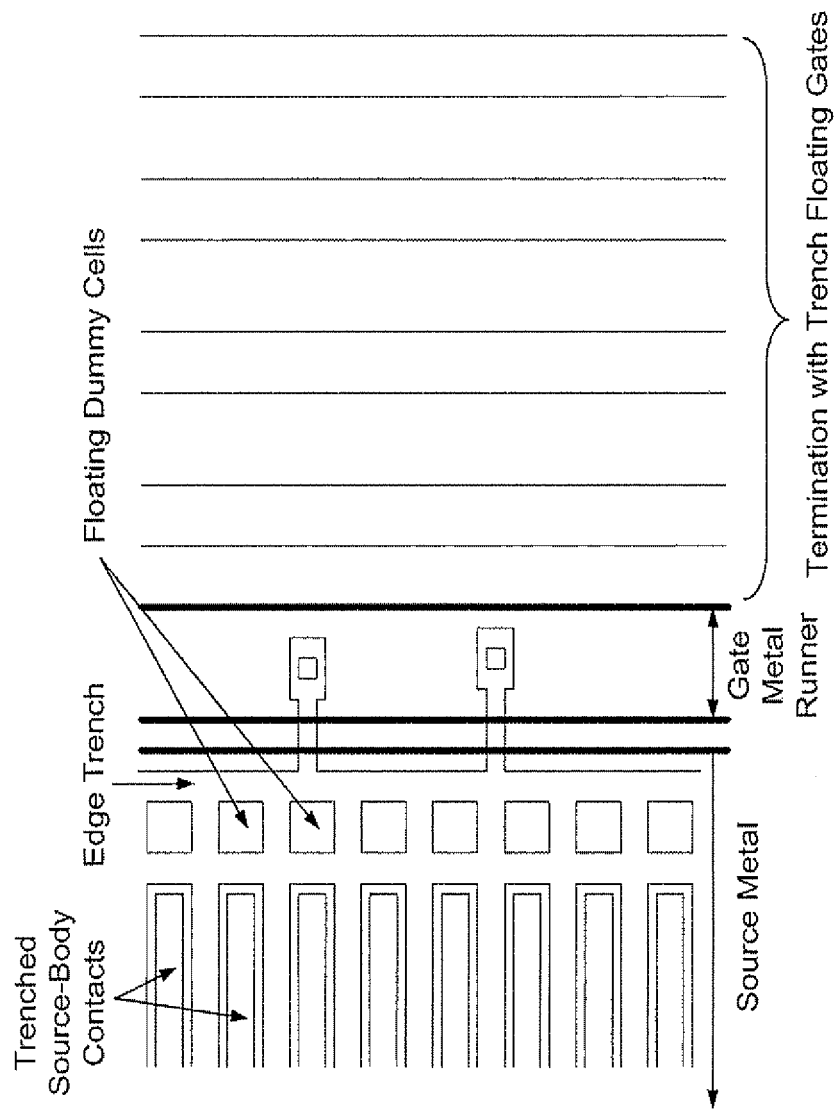
FIG. 11 is a top view of another preferred embodiment with floating dummy cells according to the present invention.

Please refer to FIG. 11 for a top view of another preferred embodiment showing a source metal area, a gate metal runner area and a termination area, which is similar to that in FIG. 9A except that, the transistor cells in FIG. 11 are stripe cells instead of square closed cells in FIG. 9A.

Figure 12:
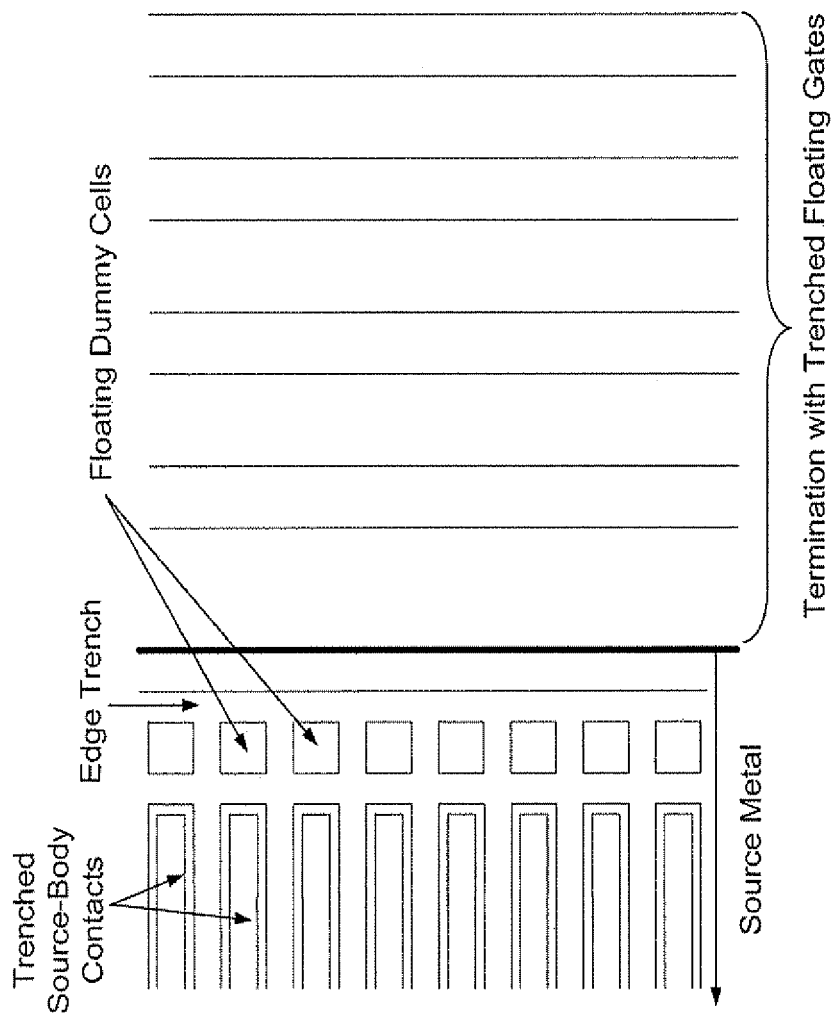
FIG. 12 is a top view of another preferred embodiment with floating dummy cells according to the present invention.

Please refer to FIG. 12 for a top view of another preferred embodiment showing a source metal area and a termination area, which is similar to that in FIG. 10A except that, the transistor cells in FIG. 12 are stripe cells instead of square closed cells in FIG. 10A.

Please refer to FIG. 13 for a top view of another preferred embodiment showing a source metal area and a termination area, which is similar to that in FIG. 12 except that, the floating dummy cells in FIG. 13 are rectangular closed cells instead of square closed cells in FIG. 12.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A trench semiconductor power MOSFET comprising a plurality of transistor cells with each cell composed of a first type trenched gate surrounded by a source region of a first conductivity type in an active area encompassed in a body region of a second conductivity type above a drain region disposed on a bottom surface of a low-resistivity substrate of said first conductivity type, wherein said first type trenched gate is composed of a doped poly-silicon layer padded by a first insulation layer as a gate oxide and said transistor cells are formed in an epitaxial layer of said first conductivity type over said low-resistivity substrate wherein said epitaxial layer has a lower doping concentration than said low-resistivity substrate, each of said transistor cells further comprising:

at least one second type trenched gate composed of said doped poly-silicon layer padded by said first insulation layer, extending to said first type trenched gate for gate connection;

a second insulation layer functioning as a contact interlayer;

a trenched source-body contact penetrating through said second insulation layer and said source region, and extending into said body region to contact both said source region and said body region in each of said transistor cells, wherein said source region has a lower doping concentration and a shallower junction depth along a channel region than along an adjacent edge of the trenched source-body contact at a same distance from a top surface of said epitaxial layer, and said source region has a doping profile of a Gaussian-distribution along the top surface of said epitaxial layer from the adjacent edge of said trenched source-body contact to said channel region;

at least one trenched gate contact penetrating through said second insulation layer and extending into said doped poly-silicon layer in said second type trenched gate;

a body contact region heavily doped with said second conductivity type underneath said source region and within said body region, surrounding at least bottom of said trenched source-body contact;

at least one floating dummy cell formed between an edge trench and said first type trenched gate, having said body region but without having said source region and said trenched source-body contact, wherein said body region in said floating dummy cell has a floating voltage; said trench semiconductor power MOSFET further comprising:

a plurality of third type trenched gates as multiple trenched floating gates in a termination area, composed of said doped poly-silicon layer padded by said first insulation layer, surrounded by said body region without said source region between two adjacent said third type trenched gates in said termination area, wherein each trench depth of said third type trenched gates is equal to or deeper than junction depth of said body region;

a source metal connected to said source region and said body region in each of said transistor cells; and a gate metal connected to said second type trenched gate.

2. The trench semiconductor power MOSFET of claim 1, wherein said trenched source-body contact has vertical sidewalls in said source region and in said body region.

3. The trench semiconductor power MOSFET of claim 1, wherein said trenched source-body contact has slope sidewalls in said source region and in said body region.

4. The trench semiconductor power MOSFET of claim 1, wherein said trenched source-body contact has vertical sidewalls in said source region, and has slope sidewalls in said body region.

5. The trench semiconductor power MOSFET of claim 1, wherein said source metal and said gate metal are composed of Al alloys or Cu alloys.

6. The trench semiconductor power MOSFET of claim 1, wherein said trenched source-body contact and said trenched gate contact are filled with a W (Tungsten) plug padded by a barrier metal layer of Ti/TiN or Co/TiN, which is connected to said source metal and said gate metal, respectively.

7. The trench semiconductor power MOSFET of claim 1, wherein said trenched source-body contact and said trenched gate contact are filled with said source metal and said gate metal, respectively.

8. The trench semiconductor power MOSFET of claim 1 further comprising a resistance-reduction layer Ti or Ti/TiN padded underneath said source metal and said gate metal.

9. The trench semiconductor power MOSFET of claim 1, wherein said transistor cells are composed of square or rectangular closed cells.

10. The trench semiconductor power MOSFET of claim 1, wherein said transistor cells are composed of stripe cells.

11. The trench semiconductor power MOSFET of claim 1, wherein said floating dummy cell is composed of a square or rectangular closed cell.

12. The trench semiconductor power MOSFET of claim 1, wherein each of said third type trenched gates has a trench width equal to or greater than said first type trenched gate.

13. The trench semiconductor power MOSFET of claim 1, wherein there is no edge trenched contact into said body region between said edge trench and said termination area, and said body region between said edge trench and said termination area has a floating voltage.

14. The trench semiconductor power MOSFET of claim 1, wherein said second insulation layer is composed of a layer of BPSG or PSG and a layer of un-doped SRO underneath.

15. The trench semiconductor power MOSFET of claim 1, wherein said second insulation layer is composed of a layer of un-doped SRO.

16. The trench semiconductor power MOSFET of claim 14, wherein said trenched source-body contact has a greater trench width in said BPSG or PSG layer than in said un-doped SRO layer.

17. The trench semiconductor power MOSFET of claim 1, wherein said second insulation layer is composed of a layer of un-doped oxide.

18. The trench semiconductor power MOSFET of claim 7, wherein said source metal and said gate metal are Al alloys layers padded with a barrier metal layer of Ti/TiN or Co/TiN.

19. The trench semiconductor power MOSFET of claim 1, wherein said gate oxide is a single gate oxide having a thickness along trench sidewalls equal to or greater than trench bottoms of said first, second and third type trenched gates.

20. The trench semiconductor power MOSFET of claim 1, wherein said gate oxide is a double gate oxide having a thickness along trench sidewalls less than trench bottoms of said first, second and third type trenched gates.

\* \* \* \* \*